United States Patent
Kumaki et al.

(10) Patent No.: US 10,144,066 B2
(45) Date of Patent: Dec. 4, 2018

(54) SILVER NANOPARTICLES, METHOD FOR PRODUCING SILVER NANOPARTICLES, AND SILVER NANOPARTICLE INK

(71) Applicant: National University Corporation Yamagata University, Yamagata-shi, Yamagata (JP)

(72) Inventors: Daisuke Kumaki, Yamagata (JP); Shizuo Tokito, Yamagata (JP)

(73) Assignee: NATIONAL UNIVERSITY CORPORATION YAMAGATA UNIVERSITY, Yamagata (JP)

( * ) Notice: Subject to any disclaimer, the term of this patent is extended or adjusted under 35 U.S.C. 154(b) by 76 days.

(21) Appl. No.: 15/037,937

(22) PCT Filed: Nov. 19, 2014

(86) PCT No.: PCT/JP2014/005829
§ 371 (c)(1),
(2) Date: May 19, 2016

(87) PCT Pub. No.: WO2015/075929
PCT Pub. Date: May 28, 2015

(65) Prior Publication Data
US 2016/0288213 A1 Oct. 6, 2016

(30) Foreign Application Priority Data

Nov. 20, 2013 (JP) .................................. 2013-239749

(51) Int. Cl.
*B22F 9/30* (2006.01)
*B22F 1/02* (2006.01)
(Continued)

(52) U.S. Cl.
CPC .................. *B22F 9/30* (2013.01); *B22F 1/02* (2013.01); *C09D 11/322* (2013.01); *C09D 11/52* (2013.01);
(Continued)

(58) Field of Classification Search
CPC .. B22F 9/30; B22F 1/02; B22F 1/0018; B22F 2301/255; B22F 2304/05; B22F 2998/10;
(Continued)

(56) References Cited

U.S. PATENT DOCUMENTS 9,137,902 B2   9/2015  Wu et al.
2010/0065789 A1*  3/2010  Sato .................... B22F 1/0022
                                              252/514

(Continued)

FOREIGN PATENT DOCUMENTS

EP    2875883 A1    5/2015
JP    2008-214695   9/2008
(Continued)

OTHER PUBLICATIONS

Extended European Search Report issued for corresponding European Patent Application No. 14863299.5, dated Jul. 21, 2017, 6 pages.

*Primary Examiner* — Harold Y Pyon
*Assistant Examiner* — Danny N Kang
(74) *Attorney, Agent, or Firm* — Hamre, Schumann, Mueller & Larson, P.C.

(57) ABSTRACT

A method for producing silver nanoparticles according to the present invention includes the steps of: mixing an amine mixture and a silver compound to yield a complex compound; and heating and decomposing the complex compound to form silver nanoparticles. The amine mixture contains: a primary amine (A) having 8 or more carbon atoms and a melting point of 20° C. or lower; a diamine (B)

(Continued)

having a primary amino group, a tertiary amino group, 4 or more carbon atoms, and a melting point of 20° C. or lower; and a cis-unsaturated primary amine (C) having 12 or more carbon atoms and a melting point of 30° C. or lower.

18 Claims, 11 Drawing Sheets

(51) Int. Cl.
  *C09D 11/322*   (2014.01)
  *H01B 1/22*   (2006.01)
  *C09D 11/52*   (2014.01)
  *H01L 29/49*   (2006.01)
  *H01L 51/05*   (2006.01)
  *H01L 51/10*   (2006.01)
  *B22F 1/00*   (2006.01)

(52) U.S. Cl.
  CPC ............ *H01B 1/22* (2013.01); *H01L 29/495* (2013.01); *H01L 29/4908* (2013.01); *B22F 1/0018* (2013.01); *B22F 2301/255* (2013.01); *B22F 2304/05* (2013.01); *B22F 2998/10* (2013.01); *B22F 2999/00* (2013.01); *H01L 51/0545* (2013.01); *H01L 51/102* (2013.01)

(58) Field of Classification Search
  CPC ... B22F 2999/00; C09D 11/322; C09D 11/52; H01B 1/22; H01L 29/4908; H01L 29/495; H01L 51/05
  USPC ......................................................... 252/500
  See application file for complete search history.

(56) References Cited

U.S. PATENT DOCUMENTS

| | | | |
|---|---|---|---|
| 2012/0043510 A1* | 2/2012 | Kurihara | B22F 1/0022 252/514 |
| 2014/0346412 A1 | 11/2014 | Okamoto et al. | |
| 2015/0206618 A1* | 7/2015 | Kozu | B22F 9/24 252/514 |
| 2015/0245480 A1 | 8/2015 | Kubo et al. | |

FOREIGN PATENT DOCUMENTS

| | | |
|---|---|---|
| JP | 2010-265543 | 11/2010 |
| JP | 2011-044709 | 3/2011 |
| JP | 2013-142173 | 7/2013 |
| JP | 2014-034602 | 2/2014 |
| JP | 2014-034690 | 2/2014 |

* cited by examiner

SILVER NANOPARTICLES, METHOD FOR PRODUCING SILVER NANOPARTICLES, AND SILVER NANOPARTICLE INK

TECHNICAL FIELD

The present invention relates to silver nanoparticles, a method for producing silver nanoparticles, and a silver nanoparticle ink. The present invention relates to a technique for forming fine conductive lines using a printing device, particularly an inkjet device.

BACKGROUND ART

In recent years, printed electronics using a printing technique has been attracting attention in the field of production of electronic devices. In particular, there is increasing emphasis on conductive inks which can be formed into conductive lines by a coating process. Processes using conductive inks allow a considerably greater reduction in cost and environmental load than conventional vacuum processes, and thus have been ranked as industrially very important techniques. The development of conductive inks and materials usable therein has been actively pursued.

Conventional conductive inks are typically a metal paste obtained by mixing metal particles having a size on the order of micrometers with a binder resin and a solvent. Such metal pastes are widely used in electronics products such as printed boards. The metal pastes, however, have to be sintered at 200 to 300° C. to exhibit electrical conductivity. It has thus been a challenge to achieve high electrical conductivity through sintering at a lower temperature.

Under these circumstances, there have recently been developed low-temperature-sinterable silver nanoparticle inks that are capable of exhibiting a high electrical conductivity of $10^{-5}$ Ω·cm or less when sintered at a temperature of 150° C. or lower. For example, Patent Literature 1 discloses a method for producing a silver nanoparticle ink that exhibits an electrical conductivity of $10^{-5}$ Ω·cm even when heated at a temperature of 100° C. or lower. The silver nanoparticles have a structure in which silver in the form of nanoparticles is covered with protective organic molecules acting as a surfactant. The action of the protective organic molecules allows the silver nanoparticles to be dispersed relatively stably in various organic solvents. Some of the protective organic molecules are desorbed from the silver nanoparticles even at room temperature, by virtue of which the silver nanoparticles exhibit high electrical conductivity even when sintered at a low temperature. Silver nanoparticles having such characteristics have made it possible to use a low-temperature process to form an electronic circuit on a plastic film having low heat resistance.

Also, the development of techniques for producing an electronic circuit or a semiconductor device by a printing process using such an conductive ink has been in progress. Conventional metal pastes have high viscosities ranging from several thousands of cps to several hundreds of thousands of cps and are often used, for example, in screen printing or gravure printing with which such metal pastes are highly compatible in terms of printability. However, the width of conductive lines printable by these printing techniques is too large. Thus, there is an increasing demand for a silver nanoparticle ink for printing devices that allows the formation of finer conductive lines.

Silver nanoparticle inks have low viscosities ranging from several to a dozen or so cps and are thus considered to be well compatible with inkjet devices. However, the use of a silver nanoparticle ink in an inkjet device for forming fine conductive lines may suffer from a problem concerning the dispersion stability of silver nanoparticles. Non-uniform dispersion of silver nanoparticles in an ink may lead to clogging with the ink in an inkjet head or to a failure of the head to discharge ink droplets straight. This precludes precise drawing of conductive lines. In inkjet devices, the amount of ink droplets discharged from the head is tiny (on the order of picoliters), and the above problem concerning the dispersibility of silver nanoparticles is likely to emerge. Silver nanoparticle inks are therefore required to be improved particularly in terms of dispersibility.

In general, it is desirable for a solvent of an ink used in a printing device such as an inkjet device to have a high boiling point of 150° C. or higher in order to prevent a defect such as clogging caused by drying of the ink. In forming finer conductive lines, the ink more readily dries due to the smaller size of ink droplets discharged. Thus, in some cases, a solvent having a higher boiling point (e.g., 200° C. or higher) is used. For example, Patent Literature 2 discloses a silver nanoparticle dispersion in which dihydroxy terpineol having a boiling point of 200° C. or higher is used as a solvent.

CITATION LIST

Patent Literature

Patent Literature 1: JP 2010-265543 A
Patent Literature 2: JP 2013-142173 A

SUMMARY OF INVENTION

Technical Problem

In Patent Literature 2, however, the silver nanoparticle dispersion is used in the form of a silver nanoparticle-containing paste for forming conductive lines with a large thickness on the order of micrometers. Patent Literature 2 gives no specific disclosure relating to the use of the silver nanoparticle dispersion in an inkjet device for forming fine conductive lines with a thickness on the order of nanometers.

Patent Literature 1 also states that the silver nanoparticle ink can be adapted for use in a printing device such as an inkjet device by appropriately selecting the solvent and the protective molecules. However, Patent Literature 1 does not disclose any specific structure and qualifications of silver nanoparticles applicable to an inkjet device for forming fine conductive lines. In addition, the suitability of the silver nanoparticle ink for use in printing devices such as inkjet devices is not clarified.

To improve the suitability for use in printing devices with maintenance of good electrical characteristics, it has been desired to discover the best combination of a structure of silver nanoparticles having low-temperature sinterability and an organic solvent in which such silver nanoparticles are uniformly dispersible.

The present invention has been made to solve the above technical problems and aims to provide silver nanoparticles that can be dispersed uniformly and stably in organic solvents having high boiling points and that are suitable for use in printing devices such as inkjet devices. The present invention also aims to provide a method for producing such silver nanoparticles and a silver nanoparticle ink.

Solution to Problem

That is, the present invention provides a method for producing silver nanoparticles, including the steps of;

mixing an amine mixture and a silver compound to yield a complex compound, the amine mixture containing a primary amine (A) having 8 or more carbon atoms and a melting point of 20° C. or lower, a diamine (B) having a primary amino group, a tertiary amino group, 4 or more carbon atoms, and a melting point of 20° C. or lower, and a cis-unsaturated primary amine (C) having 12 or more carbon atoms and a melting point of 30° C. or lower; and heating and decomposing the complex compound to form silver nanoparticles.

In another aspect, the present invention provides a silver nanoparticle ink including;

an organic solvent having a boiling point of 150° C. or higher; and silver nanoparticles dispersed in the organic solvent, the silver nanoparticles being silver nanoparticles produced by the above method.

Advantageous Effects of Invention

The technique described above is capable of yielding silver nanoparticles that can be dispersed uniformly and stably in organic solvents having high boiling points (e.g., 150° C. or higher). A silver nanoparticle ink produced using such silver nanoparticles is suitable for use in printing devices such as inkjet devices.

When a silver nanoparticle ink has silver nanoparticles dispersed uniformly in a solvent, the use of the silver nanoparticle ink allows the formation of a coating film whose electrical resistance can be lowered by sintering at a low temperature and also the formation of a silver thin film having good surface smoothness. Such a silver nanoparticle ink is suitable also for use in forming fine conductive lines by a printing device such as an inkjet device.

In addition, if the organic solvent used has a high boiling point, this leads to reduced volatilization of the solvent during use of the silver nanoparticle ink. Such a silver nanoparticle ink is less likely to cause a defect such as clogging in a printing device such as an inkjet device.

DESCRIPTION OF EMBODIMENTS

Figure 1:
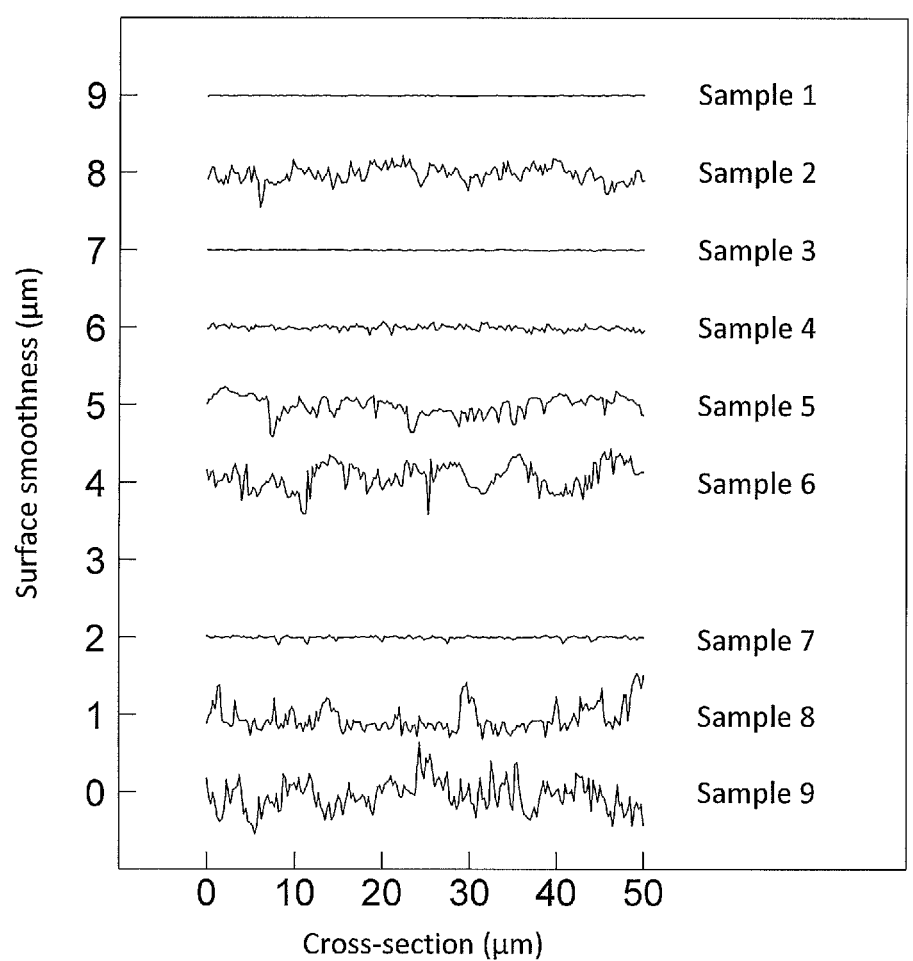
FIG. 1 shows results of evaluation of the smoothness of silver thin-film electrodes formed by spin coating using silver nanoparticle inks of Samples 1 to 9.

Hereinafter, embodiments of the present invention will be described with reference to the drawings. The present invention is not limited to the embodiments described below.

A method for producing silver nanoparticles according to the present embodiment includes the steps of: mixing a given amine mixture and a silver compound to yield a complex compound; and heating and decomposing the complex compound to form silver nanoparticles. The term "boiling point" as used herein refers to a boiling point at 1 atmosphere.

The amine mixture used in the step of yielding a complex compound (first step) contains: a primary amine (A) having 8 or more carbon atoms and a melting point of 20° C. or lower; a diamine (B) having a primary amino group, a tertiary amino group, 4 or more carbon atoms, and a melting point of 20° C. or lower; and a cis-unsaturated primary amine (C) having 12 or more carbon atoms and a melting point of 30° C. or lower. These amine compounds coordinate with silver to form the complex compound and act as protective molecules for the silver nanoparticles. The use of such an amine mixture makes it possible to obtain silver nanoparticles that can be dispersed uniformly and stably in a high-boiling organic solvent having a boiling point of 150°

C. or higher. The upper limit of the boiling point of the high-boiling organic solvent is not particularly defined and is, for example, 250° C.

It is preferable for the primary amine (A) to have a melting point of 20° C. or lower in terms of achieving homogeneous reaction for synthesis of the silver nanoparticles. In terms of reaction homogeneity required for full complexation of the silver compound, it is more preferable for the primary amine (A) to be a linear primary amine in which the number of carbon atoms is 8 to 10. Examples of the primary amine (A) include octylamine, nonylamine, 1-aminodecane, 2-ethylhexylamine, 3-(2-ethylhexyloxy) propylamine, 3-decyloxypropylamine, and 3-lauryloxypropylamine.

It is preferable also for the diamine (B) to have a melting point of 20° C. or lower in terms of achieving homogeneous reaction for synthesis of the silver nanoparticles. In terms of reaction homogeneity required for full complexation of the silver compound, it is more preferable that the number of carbon atoms in the diamine (B) be 4 to 12. Examples of the diamine (B) include N,N-dimethylethylenediamine, N,N-diethylethylenediamine, N,N-dibutylethylenediamine, N,N-dimethyl-1,3-propanediamine, N,N-diethyl-1,3-propanediamine, 3-(diibutylamino)propylamine, 2-diisopropylaminoethylamine, and dimethylaminoethoxypropylamine It is preferable for the cis-unsaturated primary amine (C) to have a melting point of 30° C. or lower in terms of achieving homogeneous reaction for synthesis of the silver nanoparticles. Examples of the cis-unsaturated primary amine (C) include oleylamine, cis-9-hexadecenylamine, and cis-9-tetradecenylamine.

The upper limit of the number of carbon atoms in each of the primary amine (A), the diamine (B), and the cis-unsaturated primary amine (C) can be defined depending on the melting point of the amine.

Examples of the silver compound to be mixed with the amine mixture include silver carboxylates, silver chloride, and silver carbonate. Among these, silver oxalate is particularly preferred. Upon heating of silver oxalate, it is decomposed, and the oxalic acid ions volatilize in the form of carbon dioxide. Thus, the formation of metal silver from silver oxalate does not require the use of a reducing agent. In addition, silver oxalate is advantageous in terms of ease of handling, since impurities are not likely to remain.

Furthermore, the amine mixture may contain a fatty acid. Fatty acids are ionically bonded to silver, which is why fatty acids can make a larger contribution to improvement in dispersion stability of the silver nanoparticles than amine compounds. However, the strength of ionic bonds between fatty acids and silver is high, and the addition of an excess amount of fatty acid to the amine mixture causes an increase in required sintering temperature. Thus, the amount of the fatty acid added is preferably 5 mol % or less with respect to silver. Examples of the fatty acid include oleic acid, palmitoleic acid, sapienic acid, linoleic acid, and linolenic acid.

Similar to fatty acids, thiols have the effect of stabilizing the silver nanoparticles through ionic bonds. Thus, a thiol may be used at a concentration of 5 mol % or less with respect to silver instead of a fatty acid. It should be appreciated that both a fatty acid and a thiol may be contained in the amine mixture. Examples of the thiol include octadecanethiol, hexadecanethiol, and tetradecanethiol.

In the step of yielding a complex compound, the amine mixture and the silver compound are mixed to yield a complex compound of the amines and the silver compound.

The total amount of the amines contained in the amine mixture is preferably equal to or more than the stoichiometric amount of silver in the silver compound. If silver that has not participated in the formation of the complex compound remains, uniform and stable dispersion of the silver nanoparticles could be precluded, for example, due to aggregation of the silver particles. Using a large amount of the amines leads to no particular defect, but causes material waste. For example, the ratio (m2/m1) of the molar amount m2 of the amines to the molar amount m1 of silver is in the range of 1 to 5.

The mixing ratio among the primary amine (A), the diamine (B), and the cis-unsaturated primary amine (C) in the amine mixture is determined as appropriate in terms of allowing the complex compound to be stably dispersed without aggregation in the amine mixture. Upon defining the total amount of the amines as 100 mol %, for example, the amine mixture contains 10 to 85 mol % of the primary amine (A), 10 to 80 mol % of the diamine (B), and 5 to 10 mol % of the cis-unsaturated primary amine (C). In an example, the amine mixture contains about 55 mol % of the primary amine (A), about 40 mol % of the diamine (B), and about 5 mol % of the cis-unsaturated primary amine (C).

The cis-unsaturated primary amine (C) is relatively resistant to desorption from the silver nanoparticles. It is thus preferable that the ratio of the amount of the cis-unsaturated primary amine (C) to the total amount of the amines be 10 mol % or less. The ratio between the primary amine (A) and the diamine (B) may be adjusted depending on the solvent used in the ink. Specifically, the lengths of the respective alkyl chains of the amines and the mixing ratio between the amines need to be adjusted as appropriate depending on the solvent used in the ink. Assuming, for example, that the primary amine (A) has 8 or more carbon atoms and the diamine (B) has a primary amino group, a tertiary amino group, and 6 or more carbon atoms, then good dispersibility of the silver nanoparticles in the solvent of the ink (particularly a solvent having a boiling point of 150° C. or higher) can be achieved by using the amines in approximately equal proportions.

The mixing of the amine mixture and the silver compound can be accomplished by stirring a mixed liquid containing the amine mixture and the silver compound at about 30 to 50° C. The formation of the complex compound can be known by changes in color and viscosity of the mixed liquid.

In the next step (second step), the complex compound formed in the previous step is heated and decomposed to form silver nanoparticles. It is preferable that the temperature at which the complex compound is heated and decomposed be 90 to 120° C., in terms of decomposing the silver compound to produce metal silver and preventing the amines from being desorbed from the resulting silver nanoparticles.

The decomposition by heating converts the reaction liquid containing the complex compound into a brownish suspension. The intended silver nanoparticles can be obtained from this suspension by a separation process such as decantation. When decantation or washing is performed, it is preferable to use an organic solvent such as an alcohol.

The silver nanoparticles obtained as above can be dispersed uniformly and stably in an organic solvent having a boiling point of 150° C. or higher. Thus, a silver nanoparticle ink that has good dispersion stability and that shows reduced volatility during use can be prepared by dispersing the silver nanoparticles in an organic solvent having a high boiling point or in a mixed liquid of two or more organic solvents having high boiling points. The silver nanoparticles obtained by the above-described production method according to the present embodiment have, for example, an average particle diameter of 100 nm or less and preferably have an average particle diameter of 30 nm or less.

The average particle diameter of the silver nanoparticles can be calculated, for example, by the following procedures. First, the silver nanoparticles are observed with an electron microscope (TEM). A square root of an area S of a silver nanoparticle in the obtained image is defined as a particle diameter a of the silver nanoparticle ($a=S^{1/2}$). The particle diameters a are calculated for 50 arbitrarily selected silver nanoparticles. The average of the calculated particle diameters a is defined as the average particle diameter of the primary particles of the silver nanoparticles.

Examples of the organic solvent that can be used in the silver nanoparticle ink include n-nonane (boiling point=150° C.), n-decane (boiling point=174° C.), n-undecane (boiling point=195° C.), n-dodecane (boiling point=216° C.), n-tridecane (boiling point=235° C.), n-tetradecane (boiling point=253° C.), n-hexanol (boiling point=157° C.), n-heptanol (boiling point=177° C.), n-octanol (boiling point=194° C.), n-nonanol (boiling point=214° C.), n-decanol (boiling point=233° C.), n-undecanol (boiling point=243° C.), and various ether-based solvents. These may be used as a mixture. In a silver nanoparticle ink obtained by dispersing the silver nanoparticles in such an organic solvent, the silver nanoparticles are kept dispersed uniformly and stably in the organic solvent. Thus, the use of such a silver nanoparticle ink in forming conductive lines with a printing device such as an inkjet device allows the resulting conductive lines to have high smoothness. In addition, low-resistance conductive lines can be formed by sintering the silver nanoparticles at a low temperature.

The organic solvent of the silver nanoparticle ink is desirably a mixed solvent containing an alcohol with a boiling point of 150° C. or higher and a nonpolar solvent with a boiling point of 150° C. or higher. The silver nanoparticle ink prepared using such a mixed solvent is resistant to drying, and has a low risk of causing a defect such as clogging in a printing device such as an inkjet device. In addition, fine conductive lines can be formed by selectively using a nonpolar solvent that does not readily spread on a surface. Furthermore, the viscosity of the silver nanoparticle ink can be adjusted, for example, by using an appropriate combination of solvents and employing an appropriate mixing ratio between the solvents. This results in an improvement in the suitability of the silver nanoparticle ink for use in printing devices such as inkjet devices.

In general, a linear alkylamine is often used as a protective molecule for silver nanoparticles. Thus, any of a linear alcohol, a linear alkane, a linear ether, and a linear acetate, which have a structure close to that of linear alkylamines and are highly compatible with linear alkylamines, is often used as a solvent of a silver nanoparticle ink. Also in the case of the silver nanoparticle ink of the present embodiment, the use of a mixed solvent containing a linear alcohol and a linear alkane can provide high dispersibility.

It should be recalled that silver nanoparticles are not necessarily dispersible uniformly in organic solvents having high boiling points. The relationship between the structure of protective molecules for silver nanoparticles and the structure of constituent molecules of an organic solvent having a high boiling point is important for dispersing the silver nanoparticles uniformly in the organic solvent having a high boiling point. In addition, it is preferable for the protective molecules to have a short alkyl chain in order to allow sintering of the silver nanoparticles at a low temperature. However, silver nanoparticles protected by protective molecules having a short alkyl chain are difficult to disperse uniformly in an organic solvent having a high boiling point because such a high-boiling solvent often has a large molecular weight and a long alkyl chain.

Figure 17:
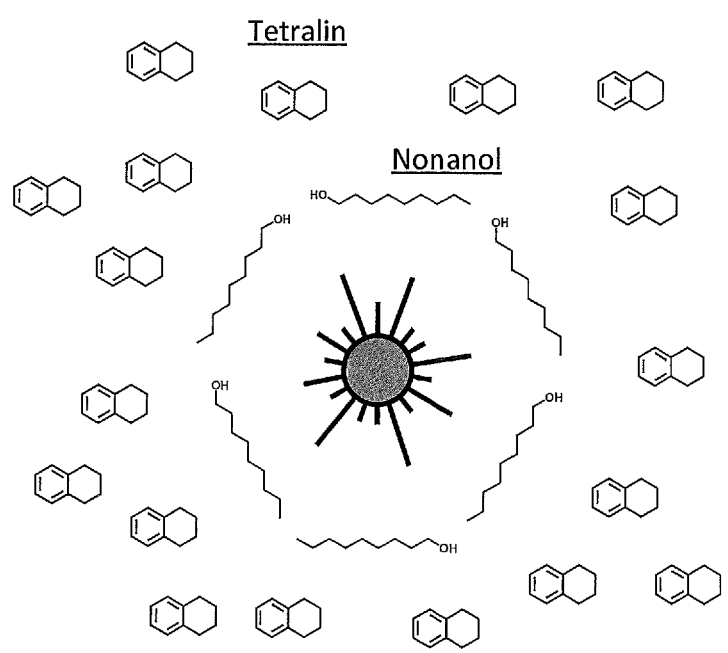
FIG. 17 shows how silver nanoparticles are dispersed in an ink.

The present inventors have found that the silver nanoparticles obtained by the production method of the present embodiment are dispersible uniformly even in a mixed solvent containing an alcohol and an organic solvent other than linear alkanes. A possible reason for this is that the silver nanoparticles produced by the method of the present embodiment have the property of being dispersed in a nonpolar organic solvent in the state of being stabilized by an alcohol. For example, in the silver nanoparticle ink of Sample 13 described later, the silver nanoparticles are presumably dispersed in tetralin in the state of being stabilized (enveloped) by n-nonanol as shown in FIG. 17. By contrast, in conventional practice, an organic solvent highly compatible with protective molecules having a relatively long alkyl chain has been selected as a solvent of a silver nanoparticle ink, and no active attempt to use a nonpolar organic solvent has been made.

An alcohol having a boiling point of 150° C. or higher is typically a linear alcohol as mentioned above. In particular, the alcohol having a boiling point of 150° C. or higher can be a linear primary alcohol having 6 or more carbon atoms and a melting point of 20° C. or lower. The use of such a linear primary alcohol allows stabilization of the silver nanoparticles. In addition, the alcohol having a boiling point of 150° C. or higher may have a dielectric constant of 15 or less, 10 or less, or 5 or less at room temperature (25° C.). Furthermore, the alcohol having a boiling point of 150° C. or higher may be a branched alcohol. In particular, when the alcohol having a boiling point of 150° C. or higher is a branched alcohol, its dielectric constant can be 15 or less, 10 or less, and 5 or less. Such alcohols are also capable of stabilizing the silver nanoparticles.

The dielectric constant of alcohols decreases with increasing number of carbon atoms. For example, the dielectric constant of n-hexanol, which has a relatively low boiling point, is about 13. Alcohols such as n-heptanol, n-octanol, and n-nonanol, which have a higher boiling point than n-hexanol, have a dielectric constant of less than 13. The decrease in dielectric constant with increasing number of carbon atoms is common to both linear alcohols and branched alcohols.

The organic solvent other than linear alkanes can be a nonpolar solvent having a boiling point of 150° C. or higher. The nonpolar solvent is, for example, a solvent having a dielectric constant of 15 or less, 10 or less, or 5 or less at room temperature (25° C.). For example, Cis-decahydronaphthalene and tetralin, which are exemplary nonpolar solvents, have a dielectric constant of 2.2 and a dielectric constant of 2.73, respectively. Linear alkane solvents have a relatively low surface free energy and have a tendency to readily spread on a surface. By contrast, nonpolar organic solvents, particularly nonpolar organic solvents containing a benzene ring (nonpolar aromatic organic solvents), have a relatively large surface free energy and have the effect of reducing the spread of the ink. The reduction in spread of the ink consequently makes it possible to form finer conductive lines by inkjet printing. In other words, the use of a nonpolar organic solvent containing a benzene ring allows control of the wettability of the ink. In addition, control of the course of drying of the ink applied to draw conductive lines is possible by appropriately selecting and combining solvents having different boiling points to prepare the above mixed solvent. This can prevent coffee stain effect which may become a problem in inkjet printing. The "coffee stain effect" refers to a phenomenon where a coating film has a higher concentration of a solute (e.g., silver nanoparticles) in its outer edge portion than in its central portion, with the result that a conductive line obtained by sintering the coating film has a greater thickness in its outer edge portion than in its central portion. It is known that this phenomenon can be prevented by drying the ink (coating film) under appropriate conditions.

It is thus desirable for the nonpolar solvent to be an organic solvent having a surface free energy of 20 mN/m to 50 mN/m at room temperature (25° C.). The use of an organic solvent having a relatively high surface free energy allows the formation of fine conductive lines and effective prevention of the coffee stain effect. The surface free energy of a liquid can be calculated by the Wilhelmy method which measures a force acting on a plate when the plate is dipped in and withdrawn from the liquid.

Specifically, at least one selected from the group consisting of tetralin (36.03 mN/m, boiling point=206° C.), Cis-decahydronaphthalene (32.46 mN/m, boiling point=193° C.), Trans-decahydronaphthalene, 1-methylnaphthalene (39.62 mN/m, boiling point=245° C.), anisole (32.7 mN/m, boiling point=154° C.), phenetole (boiling point=173° C.), mesitylene (28.6 mN/m, boiling point=165° C.), p-cymene (28.13 mN/m, boiling point=177° C.), 5-isopropyl-m-xylene (28.48 mN/m, boiling point=194° C.), 1,4-diisopropylbenzene (28.11 mN/m, boiling point=210° C.), and 1,3,5-triisopropylbenzene (27.42 mN/m, boiling point=235° C.) can be used as the nonpolar solvent having a high surface free energy. The nonpolar solvent desirably contains at least one selected from the group consisting of 1,4-diisopropylbenzene, tetralin, decahydronaphthalene, and 1-methylnaphthalene. The use of these solvents can allow effective reduction in the spread of the ink. This consequently makes it possible to form finer conductive lines by inkjet printing. When solvents each have a desired benefit (e.g., good suitability for inkjet printing), a mixture of the solvents can also provide the desired benefit. The values of the surface free energy are those measured according to the Wilhelmy method using DY-300 manufactured by Kyowa Interface Science Co., Ltd.

Alternatively, a mixed solvent of a nonpolar solvent having a relatively low dielectric constant and an alcohol having a relatively high dielectric constant can also be used. With the use of such a mixed solvent, the silver nanoparticles can be uniformly dispersed in the nonpolar solvent in the state of being stabilized by the alcohol as previously described with reference to FIG. 17. The lower limit of the dielectric constant is not particularly defined and is, for example, 0.1.

For the mixed solvent of the silver nanoparticle ink, the mixing ratio between the alcohol having a boiling point of 150° C. or higher and the nonpolar solvent having a boiling point of 150° C. or higher is not particularly limited and can be appropriately adjusted in view of, for example, the dispersibility of the silver nanoparticles and the effect of reducing the spread of the ink. The ratio (M2/M1) of the mass M2 of the nonpolar solvent to the mass M1 of the alcohol is, for example, 0 to 9. The boiling point of each of the alcohol and the nonpolar solvent contained in the mixed solvent may be 180° C. or higher or 200° C. or higher. The upper limit of the boiling point is not particularly defined and is, for example, 250° C.

The silver nanoparticle ink of the present embodiment is suitable for use in inkjet devices. It should be noted that the method for forming a coating film on a substrate using the silver nanoparticle ink is not limited to inkjet methods. The silver nanoparticle ink of the present embodiment can be used also in known thin-film formation methods such as spin coating, bar coating, spray coating, screen printing, gravure offset printing, and letterpress reverse printing.

After a coating film is formed using the silver nanoparticle ink of the present embodiment, the coating film is sintered to sinter the silver nanoparticles. The sintering temperature is preferably 200° C. or lower and more preferably 150° C. or lower. That is, the silver nanoparticles have good low-temperature sinterability, and the silver nanoparticle ink exhibits high electrical conductivity even when sintered at a low temperature. The coating film formed using the silver nanoparticle ink of the present embodiment can be sintered also by photoirradiation using, for example, a xenon flash lamp.

The silver nanoparticle ink is excellent in the dispersion stability of the silver nanoparticles, which is why a thin film having a thickness on the order of nanometers and having good smoothness can be formed also when an inkjet device is used to form fine conductive lines. This means that the silver nanoparticle ink of the present embodiment is suitable also for use in formation of thin-film electrodes. Furthermore, since sintering at a low temperature is possible as described above, the silver nanoparticle ink of the present embodiment can be applied or printed onto a substrate having low heat resistance, such as a resin substrate or paper substrate, to form conductive lines.

As thus far described, the silver nanoparticle ink according to the present embodiment is one in which silver nanoparticles obtained from a complex compound of given amines and silver are dispersed uniformly and stably in a high-boiling solvent. Thus, the silver nanoparticle ink according to the present embodiment can be suitably used in formation of fine conductive lines by a printing device, particularly an inkjet device.

With the use of the silver nanoparticle ink of the present embodiment, it is possible to form electrically-conductive structures such as conductive lines and electrodes that have a sufficiently low resistivity (e.g., $50 \times 10^{-6}$ Ω·cm or less, desirably $3 \times 10^{-6}$ to $10 \times 10^{-6}$ Ω·cm, at room temperature (25° C.)). Thus, the silver nanoparticle ink of the present embodiment can be used in production of various electronic components such as thin-film transistors, integrated circuits including thin-film transistors, touch panels, RFIDs, flexible displays, organic ELs, circuit boards, and sensor devices.

EXAMPLES

Hereinafter, the present invention will be described in more detail using examples. The present invention is not limited to the examples given below.

(Preparation of Silver Nanoparticle Inks)

[Sample 1]

An amine mixture was prepared by mixing 11.4 mmol of n-octylamine (manufactured by Tokyo Chemical Industry Co., Ltd.), 7.6 mmol of N,N-dibutylethylenediamine (manufactured by Tokyo Chemical Industry Co., Ltd.), 1 mmol of oleylamine (manufactured by Tokyo Chemical Industry Co., Ltd.), and 47.7 µL of oleic acid.

Silver oxalate was separately synthesized by mixing an aqueous solution of oxalic acid (manufactured by KANTO CHEMICAL CO., INC.) and an aqueous solution of silver nitrate (manufactured by KANTO CHEMICAL CO., INC.).

The silver oxalate was added in an amount of 1.5 g to the amine mixture, and the resulting reaction liquid was stirred at 30° C. for about 15 minutes, yielding a white silver complex compound. The reaction liquid was further stirred at 110° C. for about 10 minutes. Rising of carbon dioxide bubbles took place for some minutes, after which a bluish brown suspension having silver nanoparticles dispersed therein was obtained. Methanol (manufactured by KANTO CHEMICAL CO., INC.) was added in an amount of 10 mL to the suspension, which was subjected to centrifugation followed by removal of the supernatant. The silver nanoparticles as a precipitate were collected. To the silver nanoparticles were added 0.974 mL of n-dodecane (manufactured by Tokyo Chemical Industry Co., Ltd.) and 0.325 mL of n-nonanol (manufactured by Tokyo Chemical Industry Co., Ltd.), and thus a silver nanoparticle ink was prepared at a silver concentration of 50 wt %.

[Sample 2]

Synthesis of silver nanoparticles and preparation of a silver nanoparticle ink were performed in the same manner as for Sample 1, except for using n-dodecylamine (manufactured by Tokyo Chemical Industry Co., Ltd.) instead of oleylamine

[Sample 3]

Synthesis of silver nanoparticles and preparation of a silver nanoparticle ink were performed in the same manner as for Sample 1, except for using N,N-diethylethylenediamine (manufactured by Tokyo Chemical Industry Co., Ltd.) instead of N,N-dibutylethylenediamine.

[Sample 4]

Synthesis of silver nanoparticles and preparation of a silver nanoparticle ink were performed in the same manner as for Sample 1, except for using N,N-dimethyl-1,3-propanediamine (manufactured by Tokyo Chemical Industry Co., Ltd.) instead of N,N-dibutylethylenediamine.

[Sample 5]

Synthesis of silver nanoparticles and preparation of a silver nanoparticle ink were performed in the same manner as for Sample 1, except for using n-hexylamine (manufactured by Tokyo Chemical Industry Co., Ltd.) instead of n-octylamine

[Sample 6]

Synthesis of silver nanoparticles and preparation of a silver nanoparticle ink were performed in the same manner as for Sample 1, except for using n-butylamine (manufactured by Tokyo Chemical Industry Co., Ltd.) instead of n-octylamine

[Sample 7]

An amine mixture was prepared by mixing 11.4 mmol of n-hexylamine (manufactured by Tokyo Chemical Industry Co., Ltd.), 7.6 mmol of N,N-dimethyl-1,3-propanediamine (manufactured by Tokyo Chemical Industry Co., Ltd.), 1 mmol of n-dodecylamine (manufactured by Tokyo Chemical Industry Co., Ltd.), and 47.7 µL of oleic acid. Silver nanoparticles were synthesized in the same manner as for Sample 1, except for using this amine mixture. To the silver nanoparticles were added 1.034 mL of n-octane (manufactured by Tokyo Chemical Industry Co., Ltd.) and 0.344 mL of n-butanol, and thus a silver nanoparticle ink was prepared at a silver concentration of 50 wt %.

[Sample 8]

To the silver nanoparticles of Sample 7 were added 0.974 mL of n-dodecane (manufactured by Tokyo Chemical Industry Co., Ltd.) and 0.325 mL of n-nonanol (manufactured by Tokyo Chemical Industry Co., Ltd.), and thus a silver nanoparticle ink was prepared at a silver concentration of 50 wt %.

[Sample 9]

An amine mixture was prepared by mixing 1.1 g of n-butylamine, 0.825 g of n-hexylamine, 0.6 g of n-octylamine, and 0.24 g of oleylamine Except for using this amine mixture, synthesis of silver nanoparticles and preparation of a silver nanoparticle ink were performed in the same manner as for Sample 1.

(Test for Film Formation by Spin Coating)

Coating films were formed on glass substrates by spin coating using the silver nanoparticle inks of Samples 1 to 9. Each glass substrate was stored in an environmental test chamber set to a temperature of 30° C. and a humidity of 60% for 30 minutes, after which the glass substrate was placed on a hot plate and the coating film was sintered at 120° C. for 30 minutes. In this manner, a silver thin-film electrode was formed on each glass substrate. The volume resistivity of the silver thin-film electrodes was measured by a resistivity measurement apparatus (Model sigma-5+, manufactured by NPS, INC.). In addition, the surface smoothness of the electrodes was measured by a laser microscope (OLS-4000 manufactured by Olympus Corporation). The results are shown in Table 1 and FIG. 1.

TABLE 1

|  | Amine mixture | Solvent | Volume resistivity [×10$^{-6}$ Ω · cm] | Inkjet coating |
|---|---|---|---|---|
| Sample 1 | (A) n-octylamine (B) N,N-dibutylethylenediamine (C) Oleylamine | n-dodecane n-nonanol | 9.7 | Possible |
| Sample 2 | (A) n-octylamine (B) N,N-dibutylethylenediamine n-dodecylamine | n-dodecane n-nonanol | Not measurable | — |
| Sample 3 | (A) n-octylamine (B) N,N-diethylethylenediamine (C) Oleylamine | n-dodecane n-nonanol | 60.3 | — |
| Sample 4 | (A) n-octylamine (B) N,N-dimethyl-1,3-propanediamine (C) Oleylamine | n-dodecane n-nonanol | 328 | — |
| Sample 5 | n-hexylamine (B) N,N-dibutylethylenediamine (C) Oleylamine | n-dodecane n-nonanol | Not measurable | — |
| Sample 6 | n-butylamine (B) N,N-dibutylethylenediamine (C) Oleylamine | n-dodecane n-nonanol | Not measurable | — |
| Sample 7 | n-hexylamine (B) N,N-dimethyl-1,3-propanediamine n-dodecylamine | n-octane n-butanol | 8.6 | Impossible |

TABLE 1-continued

| | Amine mixture | Solvent | Volume resistivity [$\times 10^{-6}$ Ω·cm] | Inkjet coating |
|---|---|---|---|---|
| Sample 8 | n-hexylamine (B) N,N-dimethyl-1,3-propanediamine n-dodecylamine | n-dodecane n-nonanol | Not measurable | — |
| Sample 9 | n-butylamine n-hexylamine (A) n-octylamine (C) Oleylamine | n-dodecane n-nonanol | Not measurable | — |

FIG. 1 shows the results of evaluation of the smoothness of the silver thin-film electrodes formed by spin coating using the silver nanoparticle inks of Samples 1 to 9. In general, the higher the dispersibility of silver nanoparticles in a silver nanoparticle ink, the more likely a silver thin-film electrode having a smooth surface is to be obtained.

A smooth silver thin-film electrode was obtained from the silver nanoparticle ink of Sample 1. This leads to the inference that the silver nanoparticles were uniformly dispersed in the high-boiling solvent in the silver nanoparticle ink of Sample 1. In addition, the resistance value of the silver thin-film electrode formed using the silver nanoparticle ink of Sample 1 was $9.7 \times 10^{-6}$ Ω·cm, which was very low. By contrast, the silver thin-film electrode formed using the silver nanoparticle ink of Sample 2 was inferior in surface smoothness, had a roughness of about 0.5 µm, and showed no electrical conductivity, despite the fact that the solvent used in the silver nanoparticle ink of Sample 2 was the same as that used in Sample 1. This leads to the inference that the dispersibility of the silver nanoparticles in the solvent was poor in the silver nanoparticle ink of Sample 2. These results indicate that the use of oleylamine, which corresponds to the unsaturated primary amine (C) in which the number of carbon atoms is 18, can provide a greater improvement in the dispersion stability of silver nanoparticles in high-boiling solvents than the use of n-dodecylamine in which the number of carbon atoms is 12.

In the case where N,N-diethylethylenediamine (the number of carbon atoms=6, Sample 3) or N,N-dimethyl-1,3-propanediamine (the number of carbon atoms=5, Sample 4) having less carbon atoms and a shorter alkyl chain than N,N-dibutylethylenediamine (the number of carbon atoms=10, Sample 1) was used as the diamine (B), the dispersion stability of the silver nanoparticles in the solvent was substantially comparable to that in Sample 1. Relatively smooth silver thin-film electrodes were obtained also from the silver nanoparticle inks of Sample 3 and Sample 4. The volume resistivity of the silver thin-film electrode formed using the silver nanoparticle ink of Sample 3 was $60.3 \times 10^{-6}$ Ω·cm, which was higher than that in Sample 1. The volume resistivity of the silver thin-film electrode formed using the silver nanoparticle ink of Sample 4 was $328 \times 10^{-6}$ Ω·cm, which was higher than that in Sample 1.

In the case where n-hexylamine (the number of carbon atoms=6, Sample 5) or n-butylamine (the number of carbon atoms=4, Sample 6) having less carbon atoms and a shorter alkyl chain than n-octylamine (the number of carbon atoms=8, Sample 1) was used as the linear primary amine (A), the dispersibility of the silver nanoparticles in the solvent was markedly reduced. The silver thin-film electrodes formed using the silver nanoparticle inks of Sample 5 and Sample 6 had a roughness of nearly 1 µm and showed no electrical conductivity.

The silver nanoparticle inks of Sample 7 and Sample 8 were prepared by dispersing silver nanoparticles of Patent Literature 1 in two different solvents. When a mixed solvent of n-dodecane and n-nonanol both of which are a high-boiling solvent having a boiling point of 200° C. or higher was used (Sample 8), the dispersibility of the silver nanoparticles and the smoothness of the silver thin-film electrode were markedly lower than when a mixed solvent of octane and butanol both of which have a boiling point of about 120° C. was used (Sample 7, corresponding to Example 10 of Patent Literature 1). The volume resistivity in Sample 7 was $8.6 \times 10^{-6}$ Ω·cm, which was very low, while no electrical conductivity was shown in Sample 8. This leads to the observation that the structure of the silver nanoparticles (protective molecules) needs to be determined depending on the solvent used in the silver nanoparticle ink.

In the silver nanoparticle ink of Sample 9, silver nanoparticles produced using an amine mixture containing a plurality of primary amines and oleylamine were used. In the silver nanoparticle ink of Sample 9, n-dodecane and n-nonanol, both of which are a high-boiling solvent having a boiling point of 200° C. or higher, were used. The silver thin-film electrode formed using the silver nanoparticle ink of Sample 9 was markedly inferior in smoothness and showed no electrical conductivity. This leads to the inference that the dispersibility of the silver nanoparticles in the solvent was poor in the silver nanoparticle ink of Sample 9. Despite the fact that the silver nanoparticle ink of Sample 9 contained oleylamine which is a long-chain cis-unsaturated primary amine, the dispersion stability of the silver nanoparticles in the high-boiling solvents was low. This result leads to the observation that the structure and proportion of the protective molecules covering the silver nanoparticles need to be determined depending on the solvent.

(Inkjet Printing Test)

Next, tests for film formation by inkjet printing were conducted with an inkjet device (Material Printer DMP-2831 manufactured by FUJIFILM Dimatix, Inc.) using the silver nanoparticle inks of Sample 1 and Sample 7. Each of the silver nanoparticle inks of Sample 1 and Sample 7 was charged into a 1-picoliter ink cartridge. A conductive line was drawn on a glass substrate by means of the inkjet device and then sintered on a hot plate at 120° C. for 30 minutes. The resistance value of this conductive line (line length: 4 mm) was measured, and the volume resistivity of the conductive line was calculated from its cross-sectional area measured with a laser microscope.

The use of the silver nanoparticle ink of Sample 1 resulted in the formation of a conductive line having high flatness. The fact that the solvent had a high boiling point of 200° C. or higher allowed the inkjet device to draw the conductive line without suffering clogging.

Figure 2:
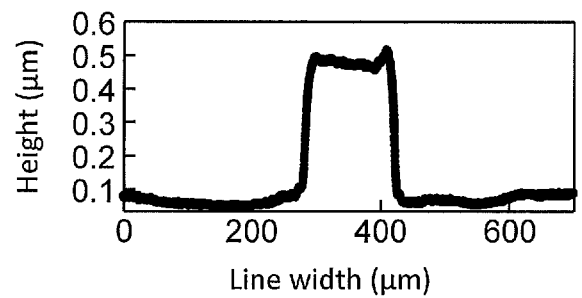
FIG. 2 is a cross-sectional profile obtained by measurement with a laser microscope for a conductive line formed by an inkjet method using a silver nanoparticle ink of Sample 1.

FIG. 2 shows a cross-sectional profile obtained by measurement with a laser microscope for the conductive line formed by the inkjet method using the silver nanoparticle ink of Sample 1. The thickness of the conductive line was about 500 nm, and the width of the conductive line was about 100 μm. The conductive line drawn was substantially free of non-uniformity in shape caused by the coffee ring effect. The volume resistivity of the conductive line calculated on the basis of the cross-sectional profile was $5 \times 10^{-5}$ Ω·cm or less, which was comparable to or lower than that of the silver thin-film electrode formed by spin coating.

The silver nanoparticle ink of Sample 7 caused clogging in the cartridge. The inkjet method using the silver nanoparticle ink of Sample 7 failed to draw a conductive line. A possible reason for this is that a mixed solvent of n-octane and n-butanol which have a boiling point of around 120° C. was used in Sample 7 and thus the silver nanoparticle ink was dried in the cartridge.

[Sample 10]

An amine mixture was prepared by mixing 11.5 mmol of n-octylamine, 7.5 mmol of N,N-dibutylethylenediamine, 1 mmol of oleylamine, and 62.7 μL of oleic acid over 15 minutes. Silver oxalate was separately synthesized by mixing an aqueous solution of oxalic acid and an aqueous solution of silver nitrate.

The silver oxalate was added in an amount of 2 g to the amine mixture, and the resulting reaction liquid was stirred at 30° C. for about 15 minutes, yielding a white silver complex compound. The reaction liquid was further stirred at 110° C. for about 10 minutes. Rising of carbon dioxide bubbles took place for some minutes, after which a bluish brown suspension having silver nanoparticles dispersed therein was obtained. Methanol was added in an amount of about 10 mL to the suspension, which was subjected to centrifugation followed by removal of the supernatant. Methanol was added again in an amount of about 10 mL to the suspension, which was further subjected to centrifugation followed by removal of the supernatant. The silver nanoparticles as a precipitate were collected. To the silver nanoparticles were added 3.31 mL of n-dodecane and 1.01 mL of n-nonanol, and thus a silver nanoparticle ink was prepared at a silver concentration of 30 wt %. Finally, the silver nanoparticle ink was passed through a filter having an aperture of 0.22 μm.

[Sample 11]

A silver nanoparticle ink was prepared in the same manner as for Sample 10, except for using a mixed solvent of 2.89 mL of 1,4-diisopropylbenzene (manufactured by Tokyo Chemical Industry Co., Ltd.) and 1.01 mL of n-nonanol as the solvent of the ink.

[Sample 12]

A silver nanoparticle ink was prepared in the same manner as for Sample 10, except for using a mixed solvent of 2.79 mL of Cis-decahydronaphthalene (manufactured by Tokyo Chemical Industry Co., Ltd.) and 1.01 mL of n-nonanol as the solvent of the ink.

[Sample 13]

A silver nanoparticle ink was prepared in the same manner as for Sample 10, except for using a mixed solvent of 2.56 mL of tetralin (manufactured by Tokyo Chemical Industry Co., Ltd.) and 1.01 mL of n-nonanol as the solvent of the ink.

[Sample 14]

A silver nanoparticle ink was prepared in the same manner as for Sample 10, except for using a mixed solvent of 2.46 mL of 1-methylnaphthalene (manufactured by Tokyo Chemical Industry Co., Ltd.) and 1.01 mL of n-nonanol as the solvent of the ink.

[Sample 15]

A silver nanoparticle ink was prepared in the same manner as for Sample 10, except for using a mixed solvent of 2.89 mL of 1,3,5-triisopropylbenzene (manufactured by Tokyo Chemical Industry Co., Ltd.) and 1.01 mL of n-nonanol as the solvent of the ink.

[Sample 16]

A silver nanoparticle ink was prepared in the same manner as for Sample 10, except for using a mixed solvent of 2.89 mL of 5-isopropyl-m-xylene (manufactured by Tokyo Chemical Industry Co., Ltd.) and 1.01 mL of n-nonanol as the solvent of the ink.

[Sample 17]

A silver nanoparticle ink was prepared in the same manner as for Sample 10, except for using a mixed solvent of 2.89 mL of p-cymene (manufactured by Tokyo Chemical Industry Co., Ltd.) and 1.01 mL of n-nonanol as the solvent of the ink.

[Sample 18]

A silver nanoparticle ink was prepared in the same manner as for Sample 10, except for using a mixed solvent of 2.89 mL of mesitylene (manufactured by Tokyo Chemical Industry Co., Ltd.) and 1.01 mL of n-nonanol as the solvent of the ink.

[Sample 19]

A silver nanoparticle ink was prepared in the same manner as for Sample 10, except for using a mixed solvent of 2.50 mL of anisole (manufactured by Tokyo Chemical Industry Co., Ltd.) and 1.01 mL of n-nonanol as the solvent of the ink.

[Sample 20]

A silver nanoparticle ink was prepared in the same manner as for Sample 10, except for using a mixed solvent of 1.94 mL of N-methylpyrrolidone (manufactured by Tokyo Chemical Industry Co., Ltd. and having a boiling point of 202° C.) and 1.01 mL of n-nonanol as the solvent of the ink.

[Sample 21]

A silver nanoparticle ink was prepared in the same manner as for Sample 10, except for using a mixed solvent of 2.27 mL of methyl benzoate (manufactured by Tokyo Chemical Industry Co., Ltd. and having a boiling point of 198° C.) and 1.01 mL of n-nonanol as the solvent of the ink.

[Sample 22]

A silver nanoparticle ink was prepared in the same manner as for Sample 10, except for using a mixed solvent of 2.12 mL of methyl salicylate (manufactured by Tokyo Chemical Industry Co., Ltd. and having a boiling point of 220° C.) and 1.01 mL of n-nonanol as the solvent of the ink.

[Sample 23]

A silver nanoparticle ink was prepared in the same manner as for Sample 10, except for using a mixed solvent of 2.62 mL of cyclohexanone (manufactured by Tokyo Chemical Industry Co., Ltd. and having a boiling point of 155° C.) and 1.01 mL of n-nonanol as the solvent of the ink.

[Sample 24]

A silver nanoparticle ink was prepared in the same manner as for Sample 10, except for using a mixed solvent of 2.22 mL of γ-butyrolactone (manufactured by Tokyo Chemical Industry Co., Ltd. and having a boiling point of 204° C.) and 1.01 mL of n-nonanol as the solvent of the ink.

[Sample 25]

A silver nanoparticle ink was prepared in the same manner as for Sample 10, except for using a mixed solvent of 2.22 mL of diethylene glycol (manufactured by Tokyo Chemical Industry Co., Ltd. and having a boiling point of 244° C.) and 1.01 mL of n-nonanol as the solvent of the ink.

(Test for Film Formation by Spin Coating)

Coating films were formed on glass substrates by spin coating using the silver nanoparticle inks of Samples 10 to 25. Each glass substrate was stored in an environmental test chamber set to a temperature of 50° C. and a humidity of 60% for 30 minutes, after which the glass substrate was placed on a hot plate and the coating film was sintered at 120° C. for 30 minutes. In this manner, a silver thin-film electrode was formed on each glass substrate. The volume resistivity of the silver thin-film electrodes was measured by the method previously described. For the silver thin-film electrodes formed using the silver nanoparticle inks of Samples 10 to 19, their surface smoothness was also measured by the method previously described. The results are shown in Tables 2 to 4, FIG. 3, and FIG. 9.

(Inkjet Printing Test)

Next, tests for film formation by inkjet printing were conducted with an inkjet device using the silver nanoparticle inks of Samples 10 to 17.

First, an underlayer was formed on a glass substrate using cross-linkable polyvinylphenol (PVP). Specifically, PVP (manufactured by Sigma-Aldrich Co., LLC.) was dissolved in propylene glycol 1-monomethyl ether 2-acetate (PEG-MEA) at a concentration of 15 wt % to obtain a PVP solution. A melamine resin (manufactured by Sigma-Aldrich Co., LLC.) was separately dissolved in PEGMEA at a concentration of 3 wt % to obtain a melamine resin solution. A mixed solution was obtained by mixing 1 mL of the PVP solution and 1 mL of the melamine resin. Decyltrimethoxysilane (manufactured by Shin-Etsu Silicones) was added in an amount of 0.5 µL to this mixed solution, which was then stirred for 10 hours. Using this mixed solution, a coating film was formed on a glass substrate by spin coating. The coating film was heated at 150° C. for 1 hour to allow cross-linking reaction of PVP to proceed. The crosslinked PVP layer formed on the glass substrate had a thickness of 250 nm.

Next, each of the silver nanoparticle inks of Samples 10 to 17 was charged into a 1-picoliter ink cartridge. The cartridge was set in an inkjet device, and then a conductive line was drawn on the glass substrate having the crosslinked PVP layer as an underlayer. Subsequently, the glass substrate was stored in an environmental test chamber set to a temperature of 50° C. and a humidity of 60% for 30 minutes, after which the glass substrate was placed on a hot plate and the conductive line was sintered at 120° C. for 30 minutes.

The surface smoothness of each sintered conductive line was measured. Specifically, a cross-sectional profile of the conductive line was measured using a contact-type film thickness meter (Dektak manufactured by Bruker Corporation). The results are shown in FIGS. 4 to 8 and 10 to 12.

To examine the wettability of the silver nanoparticle inks of Samples 10 to 14, the contact angle of each silver nanoparticle ink with the crosslinked PVP layer (underlayer) was measured using a contact angle meter (Theta, manufactured by Biolin Scientific Holding AB.). The results are shown in Table 2.

TABLE 2

| | Amine mixture | Solvent | Volume resistivity $[\times 10^{-6}\ \Omega \cdot cm]$ | Inkjet coating | Contact angle of ink (°) |
|---|---|---|---|---|---|
| Sample 10 | (A) n-octylamine (B) N,N-dibutylethylenediamine (C) Oleylamine | n-dodecane n-nonanol | 9 | Possible | 0 |
| Sample 11 | (A) n-octylamine (B) N,N-dibutylethylenediamine (C) Oleylamine | 1,4-diisopropylbenzene n-nonanol | 6.9 | Possible | 13.5 |
| Sample 12 | (A) n-octylamine (B) N,N-dibutylethylenediamine (C) Oleylamine | Cis-decahydronaphthalene n-nonanol | 9.8 | Possible | 19.5 |
| Sample 13 | (A) n-octylamine (B) N,N-dibutylethylenediamine (C) Oleylamine | Tetralin n-nonanol | 9.6 | Possible | 21.0 |
| Sample 14 | (A) n-octylamine (B) N,N-dibutylethylenediamine (C) Oleylamine | 1-methylnaphthalene n-nonanol | 13 | Possible | 24.3 |

TABLE 3

| | Amine mixture | Solvent | Volume resistivity $[\times 10^{-6}\ \Omega \cdot cm]$ | Inkjet coating |
|---|---|---|---|---|
| Sample 15 | (A) n-octylamine (B) N,N-dibutylethylenediamine (C) Oleylamine | 1,3,5-triisopropylbenzene n-nonanol | 302 | Possible |
| Sample 16 | (A) n-octylamine (B) N,N-dibutylethylenediamine (C) Oleylamine | 5-isopropyl-m-xylene n-nonanol | 19.4 | Possible |
| Sample 17 | (A) n-octylamine (B) N,N-dibutylethylenediamine (C) Oleylamine | p-cymene n-nonanol | 15.9 | Possible |
| Sample 18 | (A) n-octylamine (B) N,N-dibutylethylenediamine (C) Oleylamine | Mesitylene n-nonanol | 12.3 | Impossible |
| Sample 19 | (A) n-octylamine (B) N,N-dibutylethylenediamine (C) Oleylamine | Anisole n-nonanol | 18 | Impossible |

TABLE 4

| | Amine mixture | Solvent | Volume resistivity [×10⁻⁶ Ω · cm] | Inkjet coating |
|---|---|---|---|---|
| Sample 20 | (A) n-octylamine (B) N,N-dibutylethylenediamine (C) Oleylamine | N-methylpyrrolidone n-nonanol | Not measurable | Impossible |
| Sample 21 | (A) n-octylamine (B) N,N-dibutylethylenediamine (C) Oleylamine | Methyl benzoate n-nonanol | Not measurable | Impossible |
| Sample 22 | (A) n-octylamine (B) N,N-dibutylethylenediamine (C) Oleylamine | Methyl salicylate n-nonanol | Not measurable | Impossible |
| Sample 23 | (A) n-octylamine (B) N,N-dibutylethylenediamine (C) Oleylamine | Cyclohexanone n-nonanol | Not measurable | Impossible |
| Sample 24 | (A) n-octylamine (B) N,N-dibutylethylenediamine (C) Oleylamine | γ-butyrolactone n-nonanol | Not measurable | Impossible |
| Sample 25 | (A) n-octylamine (B) N,N-dibutylethylenediamine (C) Oleylamine | Diethylene glycol n-nonanol | Not measurable | Impossible |

All of the silver nanoparticle inks of Samples 10 to 14 were successfully passed through a filter having an aperture of 0.22 μm without any problem. This means that the silver nanoparticles were dispersed uniformly in the solvents in the silver nanoparticle inks of Samples 10 to 14.

Figure 3:
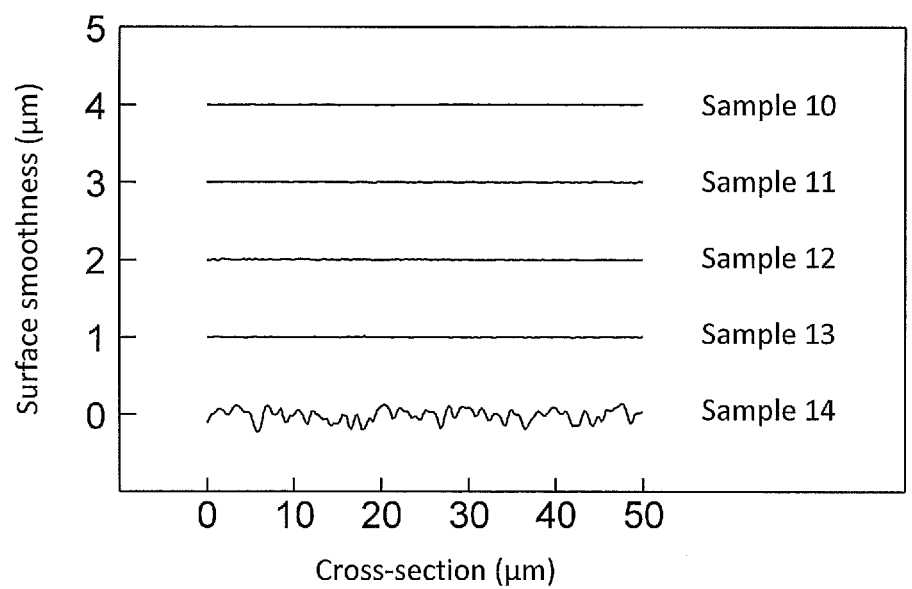
FIG. 3 shows results of evaluation of the smoothness of silver thin-film electrodes formed by spin coating using silver nanoparticle inks of Samples 10 to 14.
Figure 4:
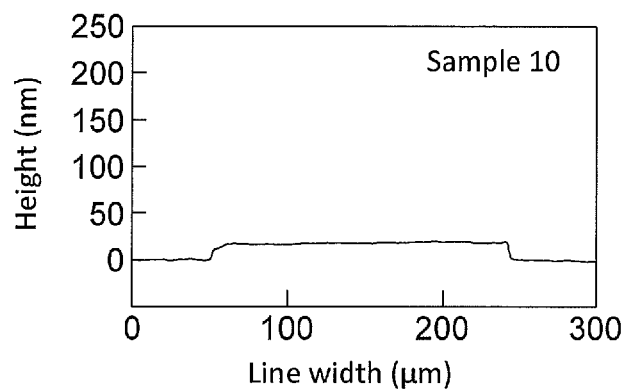
FIG. 4 is a cross-sectional profile obtained with a contact-type film thickness meter for a conductive line formed by an inkjet method using a silver nanoparticle ink of Sample 10.
Figure 5:
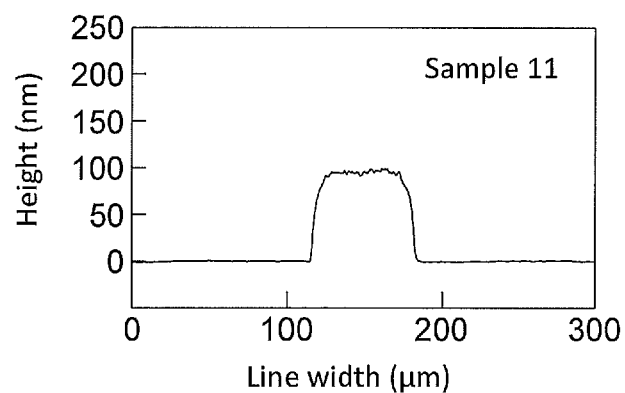
FIG. 5 is a cross-sectional profile obtained with a contact-type film thickness meter for a conductive line formed by an inkjet method using a silver nanoparticle ink of Sample 11.
Figure 6:
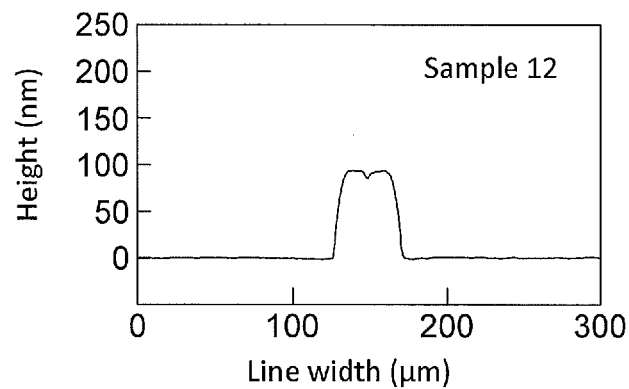
FIG. 6 is a cross-sectional profile obtained with a contact-type film thickness meter for a conductive line formed by an inkjet method using a silver nanoparticle ink of Sample 12.
Figure 7:
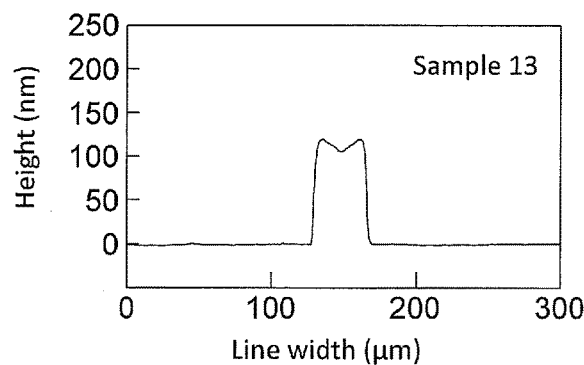
FIG. 7 is a cross-sectional profile obtained with a contact-type film thickness meter for a conductive line formed by an inkjet method using a silver nanoparticle ink of Sample 13.
Figure 8:
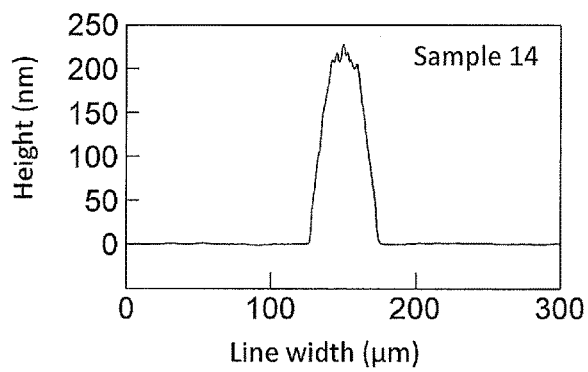
FIG. 8 is a cross-sectional profile obtained with a contact-type film thickness meter for a conductive line formed by an inkjet method using a silver nanoparticle ink of Sample 14.

As shown in FIG. 3, the surfaces of the thin films formed by spin coating using the silver nanoparticle inks of Samples 10 to 13 were very flat. This means that the dispersion stability of the silver nanoparticles in the solvents was good in the silver nanoparticle inks of Samples 10 to 13.

By contrast, the surface of the thin film formed by spin coating using the silver nanoparticle ink of Sample 14 was somewhat rough. It was found that the high boiling point of 245° C. of 1-methylnaphthalene causes drying after film formation to take a long time, during which the surface of the coating film tends to roughen. In addition, the dispersibility of the silver nanoparticles in the silver nanoparticle ink of Sample 14 was somewhat inferior to that in the silver nanoparticle inks of the other samples.

As shown in Table 2, the silver thin-film electrodes formed using the silver nanoparticle inks of Samples 10 to 13 showed very low volume resistivities of 10 μΩ·cm or less. The silver nanoparticle ink of Sample 14 showed a somewhat high resistivity, and a possible reason for this is that the surface of the coating film was rough. All of the silver nanoparticle inks of Samples 10 to 14 were usable for inkjet coating; however, the silver nanoparticle ink of Sample 14 readily caused clogging and its discharge was unstable. A possible reason for this is that, as can be understood from the result shown in FIG. 3, the dispersibility of the silver nanoparticles was somewhat poor in the silver nanoparticle ink of Sample 14.

Furthermore, the solvents (nonpolar solvents) used in the silver nanoparticle inks of Samples 10 to 14 have significantly different levels of wettability (surface free energy) from each other. That is, control of the wettability of the resulting silver nanoparticle ink was possible by appropriately selecting solvents for use in a mixed solvent. This was confirmed also from the respective contact angles of the inks with the crosslinked PVP layer. The use of dodecane having a low surface free energy provided an increase in the wettability of the resulting silver nanoparticle ink on the crosslinked PVP layer. Conversely, the use of 1-methylnaphthalene having a high surface free energy provided an increase in the contact angle of the resulting silver nanoparticle ink.

The cross-sectional profiles of FIGS. 4 to 8 showed the same trend as observed for the contact angles (Table 2) of the silver nanoparticle inks. Specifically, in the case of the silver nanoparticle ink of Sample 10 in which dodecane was used as a solvent, the extent of spread of the ink was large, which resulted in an increased width of the conductive line. In the case of the silver nanoparticle ink of Sample 14 in which 1-methylnaphthalene was used as a solvent, the extent of spread of the ink was small, which led to the successful drawing of a fine conductive line. The smallest line width was achieved in the case of using tetralin, and its value was 28 μm. These results demonstrate that solvents having a large surface free energy such as Cis-decahydronaphthalene, tetralin, and 1-methylnaphthalene are useful for forming fine conductive lines by inkjet printing.

All of the silver nanoparticle inks of Samples 15 to 19 were successfully passed through a filter having an aperture of 0.22 μm without any problem. This means that the silver nanoparticles were uniformly dispersed in the solvents in the silver nanoparticle inks of Samples 15 to 19.

Figure 9:
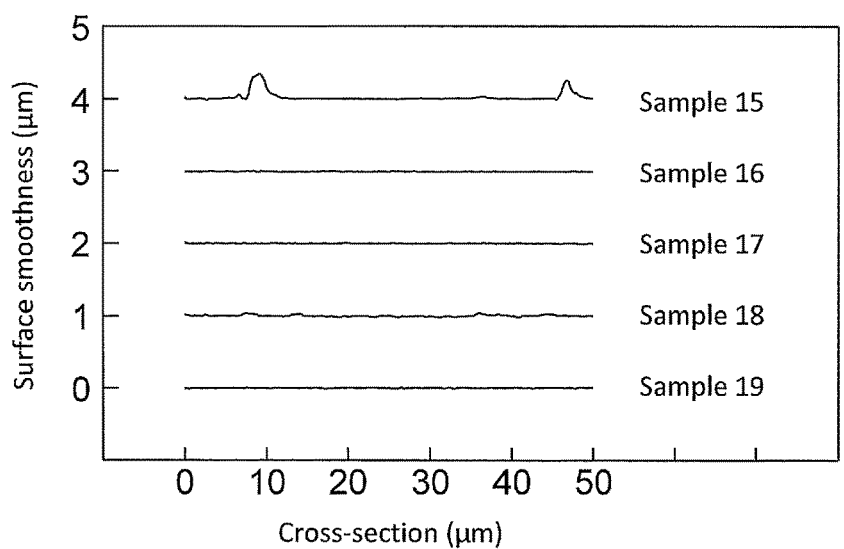
FIG. 9 shows results of evaluation of the smoothness of silver thin-film electrodes formed by spin coating using silver nanoparticle inks of Samples 15 to 19.

As shown in FIG. 9, the surfaces of the thin films formed by spin coating using the silver nanoparticle inks of Samples 15 to 19 were very flat. This means that the dispersion stability of the silver nanoparticles in the solvents was good in the silver nanoparticle inks of Samples 15 to 19.

However, the surface of the thin film formed by spin coating using the silver nanoparticle ink of Sample 15 was somewhat rough. It can be inferred that, as in the case of Sample 14 in which 1-methylnaphthalene was used, the high boiling point of 235° C. of 1,3,5-triisopropylbenzene caused drying after film formation to take a long time, during which the surface of the coating film roughened.

As shown in Table 3, the silver thin-film electrodes formed using the silver nanoparticle inks of Samples 15 to 19 showed low volume resistivities of 20 μΩ·cm or less. The silver nanoparticle ink of Sample 15 showed a volume resistivity which was an order of magnitude higher than those of the silver nanoparticles of Samples 16 to 19. A possible reason for this is that the surface of the coating film was rough. The silver nanoparticle inks of Samples 15 to 17 were usable for inkjet coating. By contrast, the silver nanoparticle inks of Sample 18 and 19 caused clogging and failed to be discharged from the 1-picoliter cartridge. The occurrence of clogging was presumably due to the somewhat low boiling points of mesitylene (boiling point=165° C.) and anisole (boiling point=154° C.). These results lead to the inference that it is desirable for the nonpolar solvent to have a boiling point of 180° C. or higher or even 200° C. or higher. This particularly applies to inkjet printing in which fine droplets are applied.

Figure 10:
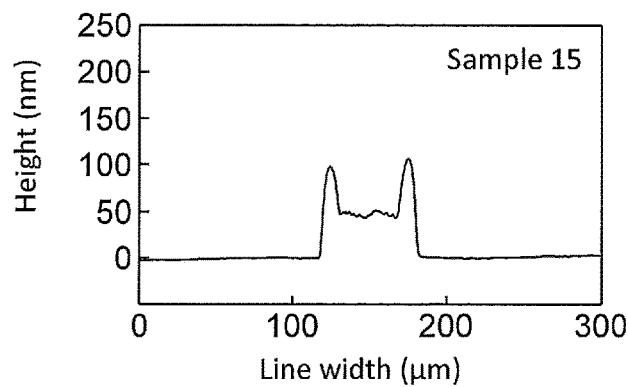
FIG. 10 is a cross-sectional profile obtained with a contact-type film thickness meter for a conductive line formed by an inkjet method using a silver nanoparticle ink of Sample 15.
Figure 11:
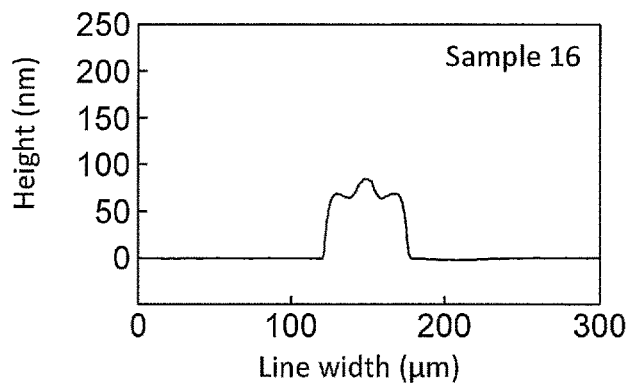
FIG. 11 is a cross-sectional profile obtained with a contact-type film thickness meter for a conductive line formed by an inkjet method using a silver nanoparticle ink of Sample 16.
Figure 12:
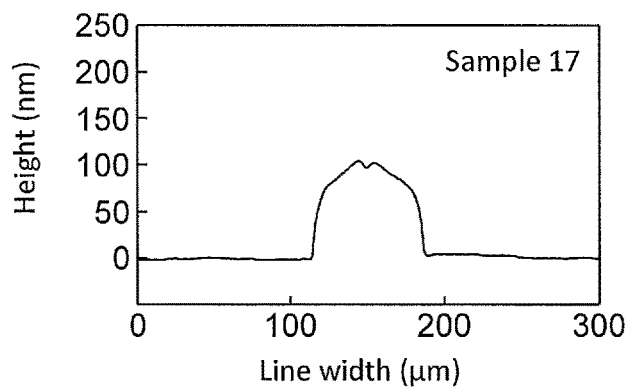
FIG. 12 is a cross-sectional profile obtained with a contact-type film thickness meter for a conductive line formed by an inkjet method using a silver nanoparticle ink of Sample 17.
Figure 13:
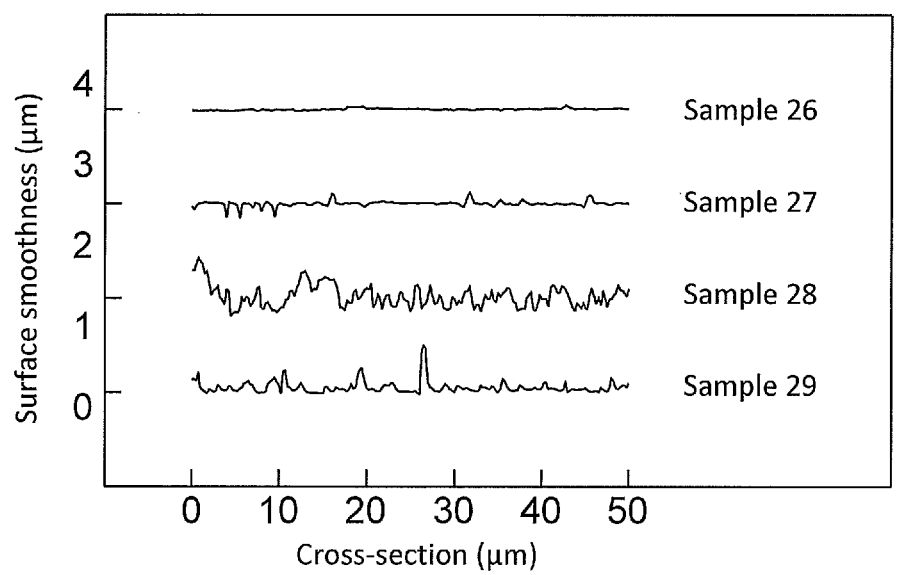
FIG. 13 shows results of evaluation of the smoothness of silver thin-film electrodes formed by spin coating using silver nanoparticle inks of Samples 26 to 29.
Figure 14:
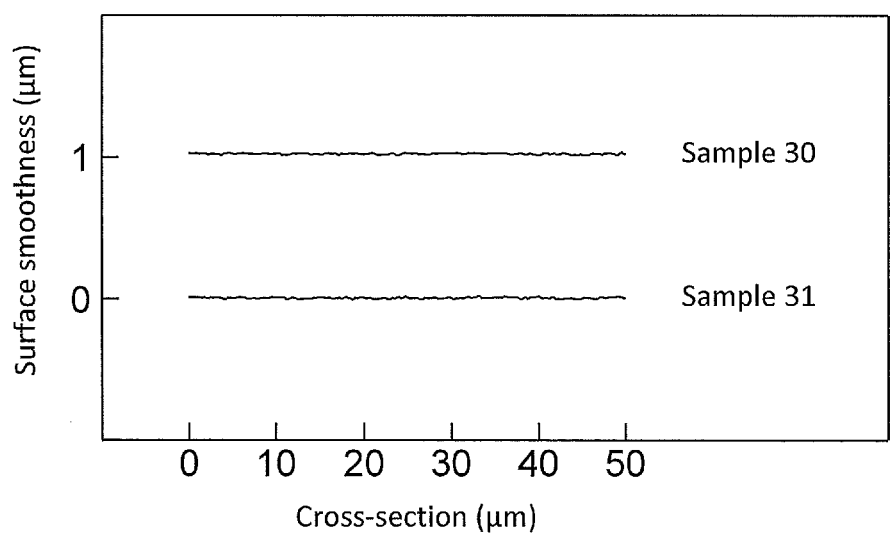
FIG. 14 shows results of evaluation of the smoothness of silver thin-film electrodes formed by spin coating using silver nanoparticle inks of Samples 30 and 31.
Figure 15:
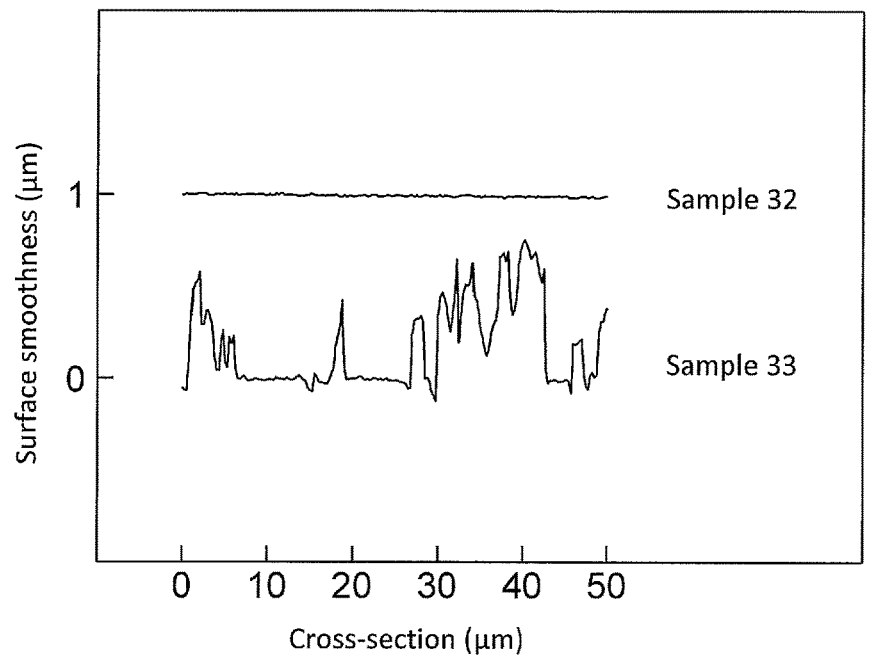
FIG. 15 shows results of evaluation of the smoothness of silver thin-film electrodes formed by spin coating using silver nanoparticle inks of Samples 32 and 33.
Figure 16:
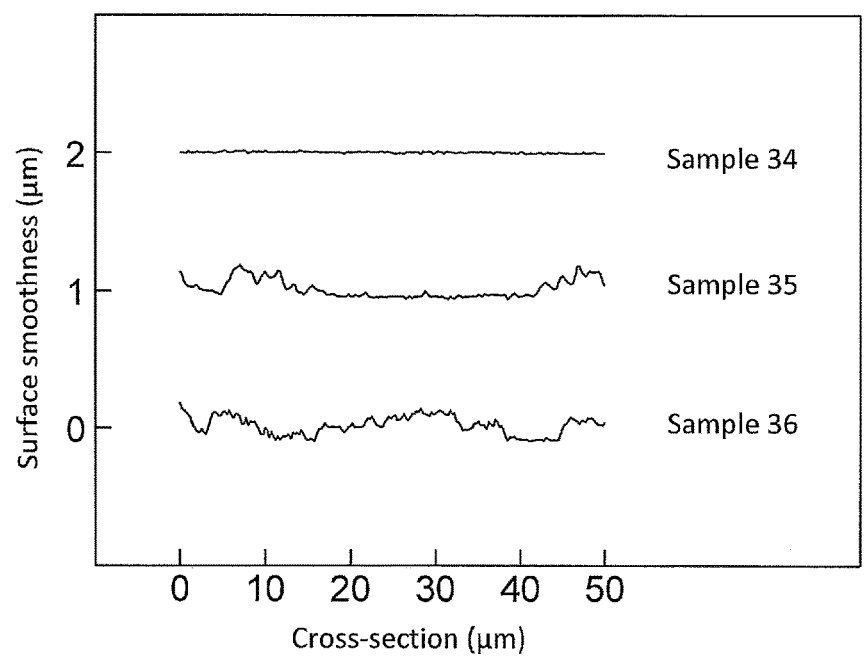
FIG. 16 shows results of evaluation of the smoothness of silver thin-film electrodes formed by spin coating using silver nanoparticle inks of Samples 34 to 36.

As shown in FIGS. 10 to 12, there was no great difference in width among the conductive lines formed using the silver nanoparticle inks of Samples 15 to 17, since the solvents (nonpolar solvents) used in these inks have substantially the same level of surface free energy. The widths of all the conductive lines were around 70 μm.

All of the silver nanoparticle inks of Samples 20 to 25 failed to pass through a filter having an aperture of 0.22 μm. A possible reason for this is that the silver nanoparticles were not dispersed stably in the mixed solvents used in Samples 20 to 25. Thus, all of the silver nanoparticle inks of Samples 20 to 25 were unusable for inkjet coating. In other words, the silver thin-film electrodes formed using the silver nanoparticle inks of Samples 20 to 25 were not in the form of a film and showed no electrical conductivity.

[Sample 26]

A silver nanoparticle ink was prepared in the same manner as for Sample 10, except for using a mixed solvent of 1.71 mL of tetralin and 2.02 mL of n-nonanol as the solvent of the ink.

[Sample 27]

A silver nanoparticle ink was prepared in the same manner as for Sample 10, except for using a mixed solvent of 2.73 mL of tetralin and 0.81 mL of n-nonanol as the solvent of the ink.

[Sample 28]

A silver nanoparticle ink was prepared in the same manner as for Sample 10, except for using a mixed solvent of 2.9 mL of tetralin and 0.61 mL of n-nonanol as the solvent of the ink.

[Sample 29]

A silver nanoparticle ink was prepared in the same manner as for Sample 10, except for using a mixed solvent of 3.08 mL of tetralin and 0.4 mL of n-nonanol as the solvent of the ink.

[Sample 30]

A silver nanoparticle ink was prepared in the same manner as for Sample 10, except for using a mixed solvent of 2.56 mL of tetralin and 1.01 mL of n-heptanol (manufactured by Tokyo Chemical Industry Co., Ltd.) as the solvent of the ink.

[Sample 31]

A silver nanoparticle ink was prepared in the same manner as for Sample 10, except for using a mixed solvent of 2.56 mL of tetralin and 1.01 mL of n-octanol (manufactured by Tokyo Chemical Industry Co., Ltd.) as the solvent of the ink.

[Sample 32]

An amine mixture was prepared by mixing 14 mmol of n-octylamine, 5 mmol of N,N-dibutylethylenediamine, 1 mmol of oleylamine, and 62.7 μL of oleic acid over 15 minutes. A silver nanoparticle ink was prepared in the same manner as for Sample 10, except for using this amine mixture.

[Sample 33]

An amine mixture was prepared by mixing 16.5 mmol of n-octylamine, 2.5 mmol of N,N-dibutylethylenediamine, 1 mmol of oleylamine, and 62.7 μL of oleic acid over 15 minutes. A silver nanoparticle ink was prepared in the same manner as for Sample 10, except for using this amine mixture.

[Sample 34]

A silver nanoparticle ink was prepared in the same manner as for Sample 33, except for using a mixed solvent of 2.56 mL of tetralin and 1.01 mL of n-heptanol as the solvent of the ink.

[Sample 35]

A silver nanoparticle ink was prepared in the same manner as for Sample 33, except for using a mixed solvent of 2.56 mL of tetralin and 1.01 mL of n-octanol as the solvent of the ink.

[Sample 36]

A silver nanoparticle ink was prepared in the same manner as for Sample 33, except for using a mixed solvent of 2.56 mL of tetralin and 1.01 mL of n-nonanol as the solvent of the ink.

(Test for Film Formation by Spin Coating)

Coating films were formed on glass substrates by spin coating using the silver nanoparticle inks of Samples 26 to 36. Each glass substrate was stored in an environmental test chamber set to a temperature of 50° C. and a humidity of 60% for 30 minutes, after which the glass substrate was placed on a hot plate and the coating film was sintered at 120° C. for 30 minutes. In this manner, a silver thin-film electrode was formed on each glass substrate. The volume resistivity and surface smoothness of the silver thin-film electrodes were measured by the methods previously described. The results are shown in Tables 5 to 8 and FIGS. 13 to 16.

TABLE 5

|  | Amine mixture | Solvent | Volume resistivity [×10$^{-6}$ Ω · cm] |
|---|---|---|---|
| Sample 26 | (A) n-octylamine<br>(B) N,N-dibutylethylenediamine<br>(C) Oleylamine | Tetralin (50 mol %)<br>n-nonanol (50 mol %) | 17.3 |
| Sample 13 | (A) n-octylamine<br>(B) N,N-dibutylethylenediamine<br>(C) Oleylamine | Tetralin (75 mol %)<br>n-nonanol (25 mol %) | 9.6 |
| Sample 27 | (A) n-octylamine<br>(B) N,N-dibutylethylenediamine<br>(C) Oleylamine | Tetralin (80 mol %)<br>n-nonanol (20 mol %) | 14.2 |
| Sample 28 | (A) n-octylamine<br>(B) N,N-dibutylethylenediamine<br>(C) Oleylamine | Tetralin (85 mol %)<br>n-nonanol (15 mol %) | 31.4 |
| Sample 29 | (A) n-octylamine<br>(B) N,N-dibutylethylenediamine<br>(C) Oleylamine | Tetralin (90 mol %)<br>n-nonanol (10 mol %) | 35.4 |

TABLE 6

| | Amine mixture | Solvent | Volume resistivity [×10⁻⁶ Ω · cm] |
|---|---|---|---|
| Sample 30 | (A) n-octylamine (B) N,N-dibutylethylenediamine (C) Oleylamine | Tetralin n-heptanol | 19.9 |
| Sample 31 | (A) n-octylamine (B) N,N-dibutylethylenediamine (C) Oleylamine | Tetralin n-octanol | 13.9 |
| Sample 13 | (A) n-octylamine (B) N,N-dibutylethylenediamine (C) Oleylamine | Tetralin n-nonanol | 9.6 |

TABLE 7

| | Amine mixture | Solvent | Volume resistivity [×10⁻⁶ Ω · cm] |
|---|---|---|---|
| Sample 10 | (A) n-octylamine (7.5 mmol) (B) N,N-dibutylethylenediamine (11.5 mmol) (C) Oleylamine | n-dodecane n-nonanol | 9 |
| Sample 32 | (A) n-octylamine (14 mmol) (B) N,N-dibutylethylenediamine (5 mmol) (C) Oleylamine | n-dodecane n-nonanol | 13.2 |
| Sample 33 | (A) n-octylamine (16.5 mmol) (B) N,N-dibutylethylenediamine (2.5 mmol) (C) Oleylamine | n-dodecane n-nonanol | 42.7 |

TABLE 8

| | Amine mixture | Solvent | Volume resistivity [×10⁻⁶ Ω · cm] |
|---|---|---|---|
| Sample 34 | (A) n-octylamine (B) N,N-dibutylethylenediamine (C) Oleylamine | Tetralin n-heptanol | 8.4 |
| Sample 35 | (A) n-octylamine (B) N,N-dibutylethylenediamine (C) Oleylamine | Tetralin n-octanol | 14 |
| Sample 36 | (A) n-octylamine (B) N,N-dibutylethylenediamine (C) Oleylamine | Tetralin n-nonanol | 39 |

Samples 26 to 29 are samples different from each other in the ratio between the linear alcohol and the nonpolar solvent in the mixed solvent. All of the silver nanoparticle inks of Samples 26 to 29 were successfully passed through a filter having an aperture of 0.22 μm without any problem. All of the silver thin-film electrodes formed using the silver nanoparticle inks of Samples 26 to 29 showed a volume resistivity of 50 μΩ·cm or less. The surfaces of the silver thin-film electrodes formed using the silver nanoparticle inks of Sample 28 and Sample 29 were somewhat rough. This leads to the inference that it is optimal for the ratio between the alcohol and the nonpolar solvent to be in the range of 1:1 to 1:4, particularly when inkjet printing is performed.

Samples 30 and 31 are samples different from each other in the length of the alkyl chain of the linear alcohol contained in the solvent. Both of the silver nanoparticle inks of Samples 31 and 32 were successfully passed through a filter having an aperture of 0.22 μm without any problem. Both of the silver thin-film electrodes formed using the silver nanoparticle inks of Samples 31 and 32 showed a volume resistivity of 50 μΩ·cm or less, and their surfaces were smooth.

Samples 32 and 33 are samples different from each other in the ratio between the alkylamine (A) and the alkyldiamine (B) in the amine mixture. Both of the silver nanoparticle inks of Samples 32 and 33 were successfully passed through a filter having an aperture of 0.22 μm without any problem. Both of the silver thin-film electrodes formed using the silver nanoparticle inks of Samples 32 and 33 showed a volume resistivity of 50 μΩ·cm or less. The results obtained for Sample 10, Sample 32, and Sample 33 show that the lower the ratio of the alkyldiamine (B) was, the lower the surface smoothness was.

Samples 34 to 36 are samples which are the same as Sample 33, except that the linear alcohols in the solvents are different. The result obtained for Sample 34 revealed that the use of an alcohol having a short alkyl chain provides improvements in dispersibility and surface smoothness even when the ratio of the alkyldiamine (B) in synthesis of silver nanoparticles is 2.5 mmol, which is low.

(Fabrication of Organic Thin-Film Transistor)

Figure 18A:
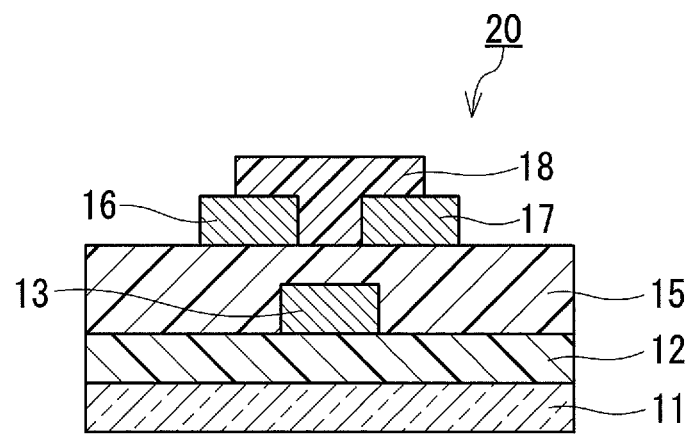
FIG. 18A is a schematic cross-sectional view of an organic transistor.
Figure 18B:
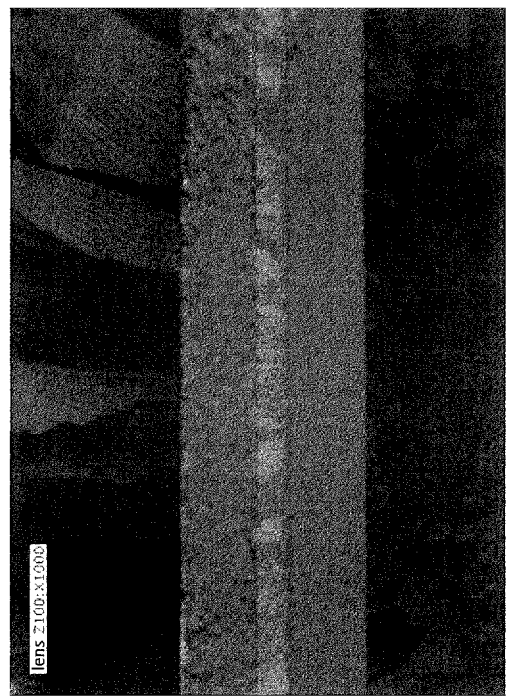
FIG. 18B is a plan-view microscope photograph of an organic thin-film transistor fabricated using the silver nanoparticle ink of Sample 13.

An organic thin-film transistor having a structure shown in FIG. 18A was fabricated using the silver nanoparticle ink of Sample 13. A plan view of the fabricated organic thin-film transistor is shown in FIG. 18B.

As shown in FIG. 18A, a thin-film transistor 20 includes a substrate 11, an underlayer 12, a gate electrode 13, a gate insulating film 15, a source electrode 16, a drain electrode 17, and an organic semiconductor layer 18. The underlayer 12 is formed of, for example, an insulating resin. On the underlayer 12 there is formed the gate electrode 13. The gate electrode 13 can be formed by applying and sintering the silver nanoparticle ink on the underlayer 12. The gate insulating film 15 covers the gate electrode 13. On the gate insulating film 15 there are formed the source electrode 16 and the drain electrode 17. The source electrode 16 and the drain electrode 17 can be formed by applying and sintering the silver nanoparticle ink on the gate insulating film 15.

Figure 19:
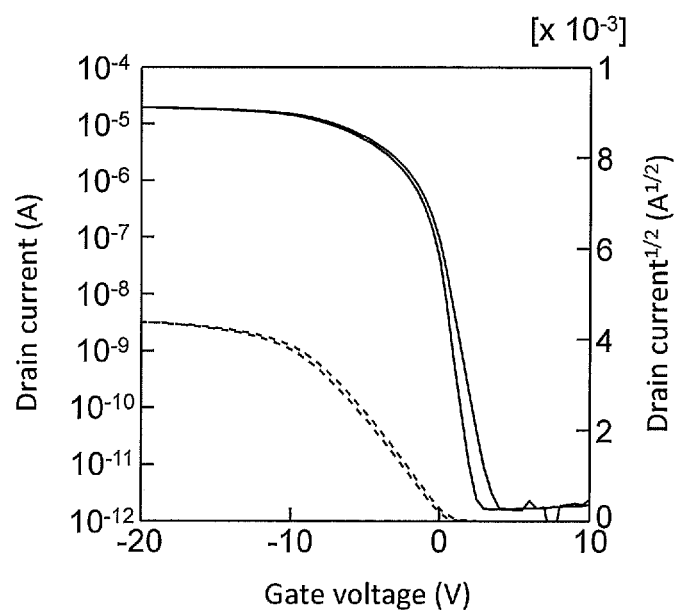
FIG. 19 is a graph showing the characteristics of the organic thin-film transistor shown in FIG. 18B.

The characteristics of the fabricated organic thin-film transistor were evaluated using a semiconductor parameter analyzer (4200-SCS, manufactured by Keithley Instruments). The result of the measurement of the transfer characteristics is shown in FIG. 19. FIG. 19 shows the variation in drain current observed when the gate voltage was varied from 10 V to −20 V with the drain voltage set at −20 V. The drain current began to flow when the gate voltage became around −3 V, and a current of more than 10⁻⁵ A flowed when the gate voltage was about −10 V. The electron field-effect mobility calculated from the variation in drain current was 0.5 cm²/Vs.

(Drawing of Conductive Line on Glossy Paper)

Figure 20A:
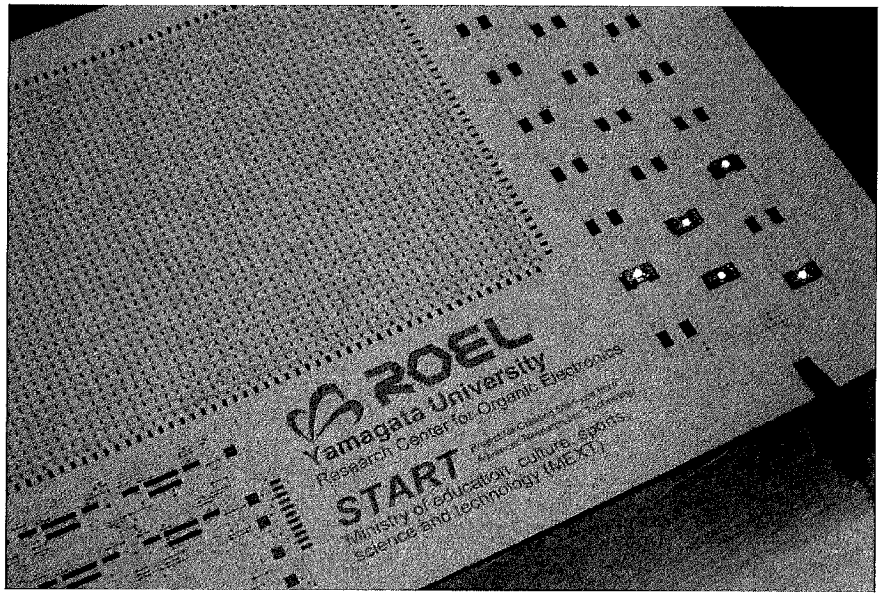
FIG. 20A is an overall view of an LED circuit formed on glossy paper using the silver nanoparticle ink of Sample 13.

A silver nanoparticle ink (Sample 13) was charged into a 1-picoliter cartridge, and conductive lines and electrode pads were drawn on a surface of commercially-available glossy paper (Epson Photo Paper: Glossy). The glossy paper was stored in an environmental test chamber set to a temperature of 50° C. and a humidity of 60% for 30 minutes, after which the glossy paper was placed on a hot plate, and the conductive lines and the electrode pads were sintered at 50° C. for 30 minutes. On the electrode pads were connected LEDs, to which three dry batteries were connected in series. As a result, light emission of the LEDs was observed as shown in FIG. 20A.

Figure 20B:
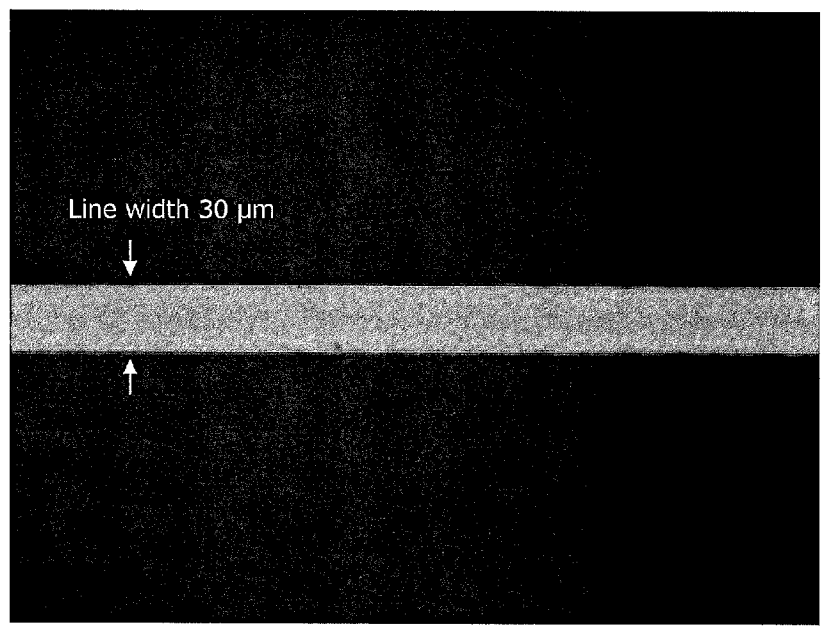
FIG. 20B is a plan-view microscope photograph of a conductive line formed on glossy paper using the silver nanoparticle ink of Sample 13.

As shown in FIG. 20B, a measured width of the conductive line drawn by inkjet printing on the glossy paper was 30 µm, which was substantially comparable to the width of the conductive line drawn on a glass substrate.

The invention claimed is:

1. A silver nanoparticle ink comprising:
   an organic solvent having a boiling point of 150° C. or higher; and
   silver nanoparticles dispersed in the organic solvent, the silver nanoparticles being covered with amines, wherein
   the silver nanoparticles covered with amines comprise:
      protective molecules comprising a primary amine (A) having 8 or more carbon atoms and a melting point of 20° C. or lower, a diamine (B) having a primary amino group, a tertiary amino group, 4 or more carbon atoms, and a melting point of 20° C. or lower, and a cis-unsaturated primary amine (C) having 12 or more carbon atoms and a melting point of 30° C. or lower; and
      silver nanoparticles each covered with the protective molecules, and
   the organic solvent is a mixed solvent comprising an alcohol having a boiling point of 150° C. or higher and a nonpolar solvent having a boiling point of 150° C. or higher.

2. The silver nanoparticle ink according to claim 1, wherein the alcohol is a linear primary alcohol having 6 or more carbon atoms and a melting point of 20° C. or lower.

3. The silver nanoparticle ink according to claim 1, wherein both the alcohol and the nonpolar solvent have a dielectric constant of 15 or less.

4. The silver nanoparticle ink according to claim 1, wherein the nonpolar solvent is an organic solvent having a surface free energy of 20 mN/m to 50 mN/m.

5. The silver nanoparticle ink according to claim 1, wherein the nonpolar solvent contains at least one selected from the group consisting of 1,4-diisopropylbenzene, tetralin, decahydronaphthalene, and 1-methylnaphthalene.

6. An electrode, formed using the silver nanoparticle ink according to claim 1.

7. A thin-film transistor, formed using the silver nanoparticle ink according to claim 1.

8. The silver nanoparticle ink according to claim 1, wherein the primary amine (A) is a linear primary amine in which the number of carbon atoms is 8 to 10.

9. The silver nanoparticle ink according to claim 1, wherein the primary amine (A) comprises at least one selected from the group consisting of octylamine, nonylamine, 1-aminodecane, 2-ethylhexylamine, 3-(2-ethylhexyloxy)propylamine, 3-decyloxypropylamine, and 3-lauryloxypropylamine.

10. The silver nanoparticle ink according to claim 1, wherein the number of carbon atoms in the diamine (B) is 4 to 12.

11. The silver nanoparticle ink according to claim 1, wherein the diamine (B) comprises at least one selected from the group consisting of N,N-dimethylethylenediamine, N,N-diethylethylenediamine, N,N-dibutylethylenediamine, N,N-dimethyl-1,3-propanediamine, N,N-diethyl-1,3-propanediamine, 3-(dibutylamino)propylamine, 2-diisopropylaminoethylamine, and dimethylaminoethoxypropylamine.

12. The silver nanoparticle ink according to claim 1, wherein the cis-unsaturated primary amine (C) comprises at least one selected from the group consisting of oleylamine, cis-9-hexadecenylamine, and cis-9-tetradecenylamine.

13. The silver nanoparticle ink according to claim 1, wherein the protective molecules further comprise a fatty acid.

14. The silver nanoparticle ink according to claim 1, wherein the protective molecules further comprise a thiol.

15. A method for producing silver nanoparticle ink, comprising the steps of:
   mixing an amine mixture and a silver compound to yield a complex compound, the amine mixture containing a primary amine (A) having 8 or more carbon atoms and a melting point of 20° C. or lower, a diamine (B) having a primary amino group, a tertiary amino group, 4 or more carbon atoms, and a melting point of 20° C. or lower, and a cis-unsaturated primary amine (C) having 12 or more carbon atoms and a melting point of 30° C. or lower;
   heating and decomposing the complex compound to form silver nanoparticles; and
   dispersing the silver nanoparticles in an organic solvent having a boiling point of 150° C. or higher,
   wherein the organic solvent is a mixed solvent containing an alcohol having a boiling point of 150° C. or higher and a nonpolar solvent having a boiling point of 150° C. or higher.

16. The method for producing silver nanoparticle ink according to claim 15, wherein
   the primary amine (A) is a linear primary amine in which the number of carbon atoms is 8 to 10, and
   the number of carbon atoms in the diamine (B) is 4 to 12.

17. The method for producing silver nanoparticle ink according to claim 15, wherein the amine mixture further contains a fatty acid.

18. The method for producing silver nanoparticle ink according to claim 15, wherein the amine mixture further contains a thiol.

* * * * *